(12) United States Patent
Sidorin et al.

(10) Patent No.: US 7,027,469 B2
(45) Date of Patent: Apr. 11, 2006

(54) TUNABLE FILTER

(75) Inventors: Yakov Sidorin, Tucson, AZ (US);
Abdul H Damirji, London (GB); Salah A Al-Chalabi, London (GB)

(73) Assignee: Optitune plc, London (GB)

(*) Notice: Subject to any disclaimer, the term of this patent is extended or adjusted under 35 U.S.C. 154(b) by 0 days.

(21) Appl. No.: 10/306,843

(22) Filed: Nov. 29, 2002

(65) Prior Publication Data

US 2003/0214700 A1 Nov. 20, 2003

Related U.S. Application Data

(60) Provisional application No. 60/421,143, filed on Nov. 30, 2001.

(30) Foreign Application Priority Data

Oct. 4, 2002 (GB) .................................. 0223052

(51) Int. Cl.
*H01S 3/10* (2006.01)
(52) U.S. Cl. ........................................ 372/20; 372/102
(58) Field of Classification Search ................ 372/20, 372/96, 99, 102
See application file for complete search history.

(56) References Cited

U.S. PATENT DOCUMENTS

| | | | |
|---|---|---|---|
| 4,571,024 A * | 2/1986 | Husbands | .................... 385/37 |
| 4,719,635 A | 1/1988 | Yeh | ............... 372/50 |
| 4,786,132 A | 11/1988 | Gordon | |
| 4,850,682 A | 7/1989 | Gerritsen | .................... 349/201 |
| 5,042,898 A | 8/1991 | Morey et al. | |
| 5,319,668 A | 6/1994 | Luecke | |
| 5,448,398 A | 9/1995 | Asakura et al. | ............. 359/328 |
| 5,732,102 A | 3/1998 | Bouadma | |
| 5,771,252 A | 6/1998 | Lang et al. | |
| 5,870,417 A | 2/1999 | Verdiell et al. | |
| 5,943,352 A | 8/1999 | Fee | |
| 5,995,521 A | 11/1999 | Moore et al. | |
| 6,041,071 A | 3/2000 | Tayebati | |

(Continued)

FOREIGN PATENT DOCUMENTS

EP 0 502 682 9/1992

(Continued)

OTHER PUBLICATIONS

Hiroshi, Patent Abstracts of Japan, vol. 012, No. 397 (E-672), Pub. No. 63137493; Oct. 21, 1988, Abstract Only.

(Continued)

*Primary Examiner*—Minsun O Harvey
*Assistant Examiner*—James Menefee
(74) *Attorney, Agent, or Firm*—Nixon & Vanderhye P.C.

(57) ABSTRACT

In a tunable optical source, a diffraction device 115 is used to provide wavelength selective feedback to a laser diode 100. The diffraction device 115 is at least partially fabricated in a material whose refractive index is controllable so as to control the diffraction performance of the device. This allows the diffraction device 115 to be used in tuning the optical source, potentially without using moving parts. For instance, the refractive index can be controlled using a temperature change across material of the device 115. The diffraction device 115 can be mounted in free space in an external cavity with respect to the laser diode 100. Novel forms of diffraction device 115 are described. Tunable optical sources of this type can be used for instance in communications, particularly wavelength division multiplexing.

31 Claims, 6 Drawing Sheets

U.S. PATENT DOCUMENTS

| | | |
|---|---|---|
| 6,049,554 A | 4/2000 | Lang et al. |
| 6,081,539 A | 6/2000 | Mattori et al. |
| 6,108,355 A | 8/2000 | Zorabedian |
| 6,144,795 A | 11/2000 | Dawes et al. |
| 6,192,059 B1 | 2/2001 | Karioja et al. |
| 6,205,159 B1 | 3/2001 | Sesko et al. |
| 6,215,928 B1 | 4/2001 | Friesem et al. .............. 385/37 |
| 6,219,478 B1 | 4/2001 | Parriaux et al. .............. 385/37 |
| 6,243,517 B1 | 6/2001 | Deacon |
| 6,275,317 B1 | 8/2001 | Doerr et al. |
| 6,320,888 B1 | 11/2001 | Tanaka et al. |
| 6,411,746 B1 | 6/2002 | Chamberlain et al. |
| 6,436,613 B1 | 8/2002 | Fallahi et al. |
| 6,480,513 B1 * | 11/2002 | Kapany et al. .............. 372/20 |
| 6,488,414 B1 | 12/2002 | Dawes et al. |
| 6,632,585 B1 | 10/2003 | Nakamura |
| 6,678,291 B1 * | 1/2004 | Vogler et al. .............. 372/32 |
| 6,683,895 B1 * | 1/2004 | Pilgrim et al. .............. 372/20 |
| 6,795,473 B1 * | 9/2004 | Kleinschmidt et al. ....... 372/57 |
| 2001/0005387 A1 * | 6/2001 | Yamada et al. .............. 372/20 |
| 2001/0014429 A1 | 8/2001 | Iha |
| 2001/0016093 A1 | 8/2001 | Dawes et al. |
| 2002/0169270 A1 | 11/2002 | Amberg-Schwab et al. |
| 2004/0037531 A1 | 2/2004 | Andrews et al. |
| 2004/0105480 A1 * | 6/2004 | Sidorin et al. .............. 372/97 |

FOREIGN PATENT DOCUMENTS

| | | |
|---|---|---|
| EP | 1341277 A2 | 9/2003 |
| WO | WO 02/29944 | 4/2002 |

OTHER PUBLICATIONS

Yuichi, M., Patent Abstracts of Japan, vol. 007, No. 154 (E-185), Pub No. 58061692; Jul. 6, 1983, Abstract Only.

Nyairo et al., "Multichannel Grating Cavity (MGC) Laser Transmitter For Wavelength Division Multiplexing Applications," IEE Proceedings J. Optoelectronics, Institution Of Electrical Engineers, Stevenage, GB, vol. 138, No. 5, Part J, Oct. 1, 1991, pp. 337-342, XP000267777, ISSN: 0267-3932.

Terahertz Photonics Ltd., Brochure (developers of Hybrid Photonic Integrated Circuit (PIC)), United Kingdom, 2 pgs.

"Two-element-cavity femtosecond Cr4+: YAG laser"; T Tomaru, Conf. Proc. Lasers & Electro-Optics, vol. 56, p. 4-4, May 6, 2001.

Merimaa et al., "Compact External-Cavity Diode Laser With a Novel Transmission Geometry", Optics Communications. Jan. 15, 2000; pp. (175-180).

* cited by examiner

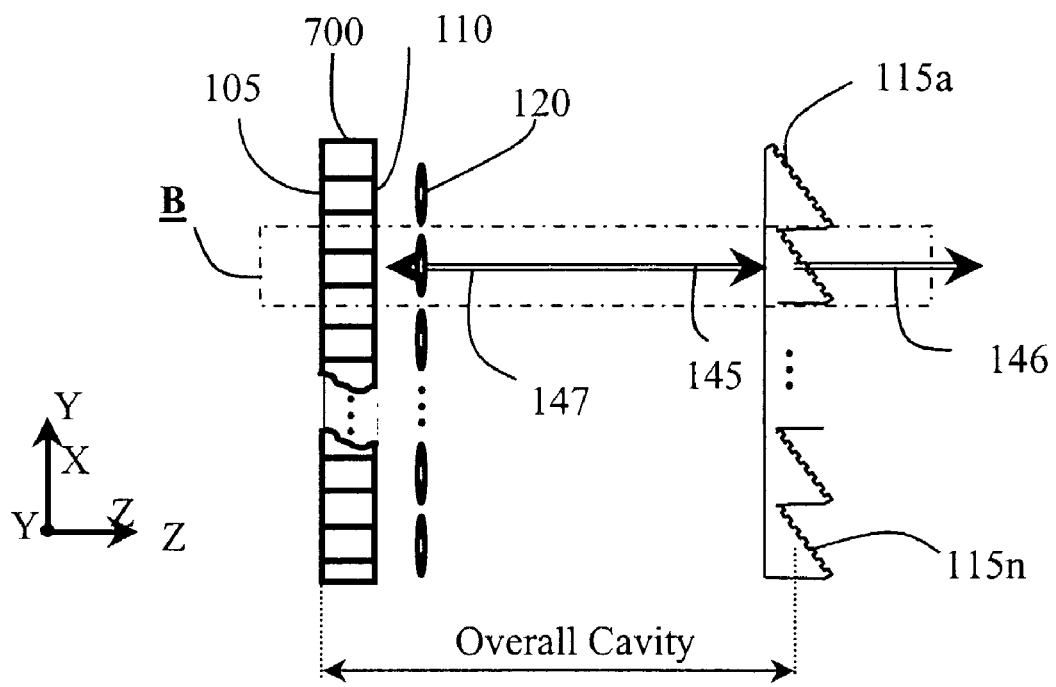
FIGURE 7
FIGURE 8
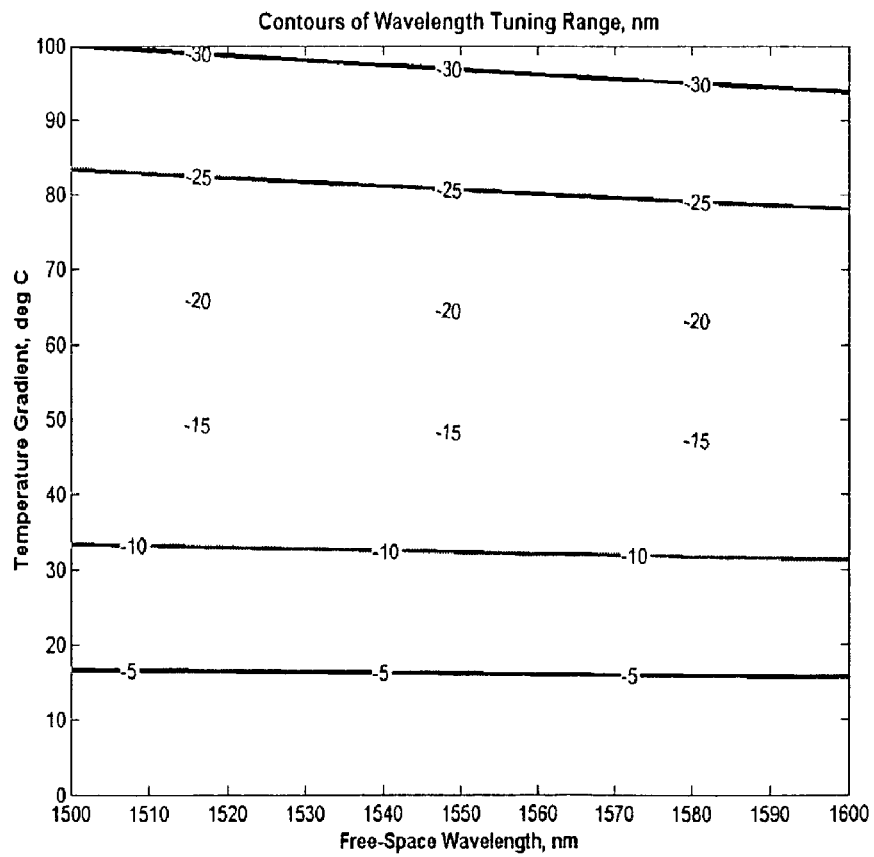

TUNABLE FILTER

CROSS REFERENCE TO RELATED APPLICATIONS:

This Application claims the benefit of U.S. Provisional Application No. 60/421,143 filed Nov. 30, 2001, entitled "Tunable Filter", and naming Yakov Sidorin, Abdur Hadi Damirji and Salah Al-Chalabi as inventors. This application also claims the benefit of priority based on Great Britain (GB) Application 0223052.2 filed Oct. 4, 2002. The contents of the above identified U.S. Provisional Application and GB Application 0223052.2 are incorporated herein by reference.

BACKGROUND

1. Technical Field

The present invention relates to tunable filters, and finds particular application in the use of gratings in tuning optical sources.

2. Description of Related Art

Semiconductor laser diodes are known as optical sources. Various techniques are used to obtain single mode, narrow linewidth operation which is desirable in applications such as communications. For instance, unmodified edge emitting laser diodes typically operate with several longitudinal modes lasing simultaneously, leading to low coherence and large linewidths. A technique known for use with edge emitting laser diodes is to use a grating to act as a wavelength filter in providing feedback to the lasing cavity to obtain single mode operation. Examples are the distributed feedback (DFB) and distributed Bragg reflector (DBR) lasers in which a grating extends at least partially along the length of the lasing cavity, or a neighbouring cavity, being formed for instance in the surface of a substrate supporting the lasing cavity and any neighbouring cavity.

An external cavity laser (ECL) is another known arrangement which uses wavelength selective feedback to obtain single mode operation. In this case, the lasing cavity is coupled via an end facet to a further cavity, usually in free space, that contains a wavelength-selective feedback mechanism to provide feedback to the lasing cavity. The wavelength-selective feedback mechanism typically comprises individually mounted wavelength-selective optics in the free space. In the ECL, the "lasing" cavity is sometimes described as a "gain" cavity rather than a lasing cavity as the end facet is anti-reflection coated, giving the laser diode the construction of a gain element rather than a laser. DFB/DBR and ECL lasers differ in more than one way. Firstly, DFB/DBR lasers are generally monolithic, their lasing and feedback sections being fabricated on the same substrate. This is in contrast to an ECL in which the wavelength-selective optics are usually fabricated separately and mounted in relation to the lasing cavity in a separate mounting operation. Secondly, wavelength selection in an ECL is generally provided by some sort of filtering device having filtering elements arranged to provide a plane or surface which is transverse to the optical path of radiation from the lasing cavity and plays a part in defining the length of the external cavity, often in free space. This is in contrast to the distributed feedback arrangement in which the wavelength selection mechanism is distributed longitudinally along the optical path of the radiation in a waveguide. In an ECL, wavelength selection can be provided for instance by a diffraction grating operating in reflection mode and providing a facet in or of the external cavity. The facet may uniquely, or in combination with one or more further feedback elements such as a mirror, define the physical length of the external cavity by providing a discrete change in direction in the optical path. In a DFB/DBR arrangement, wavelength selection is provided at least predominantly by a longitudinally extending, distributed grating such as a distributed Bragg reflector which does not play a part in defining the length of a cavity but instead is part of a waveguiding structure.

In the above, reference is made to a diffraction grating operating "in reflection mode". This can generally be taken to mean that the radiation incident upon the grating is diffracted by it to the same side of the grating as it was incident upon it. Thus a grating device operating in reflection mode does not have to be transparent to the optical radiation throughout its thickness. In contrast, a diffraction grating device operating "in transmission mode" is generally transparent to the optical radiation to at least some degree throughout its thickness. Thus it can be used to diffract the incident radiation to either side of the grating. In this case, a portion of the incident radiation can be collected on a different side of the grating from the side on which it was incident.

Lasers are also known which are tunable. Tunable optical sources are required in optical communications systems, cable television systems, local area networks and measurement equipment. For instance in wavelength division multiplexing as used in communications it is necessary to provide optical sources which can operate at distinguishable wavelengths. Although an array of separate devices can be used, each tuned to one of the wavelengths, it becomes expensive to maintain a supply of backup lasers since there has to be a backup laser for every device in the array. In this scenario, it has been recognised that it is preferable to have a tunable laser as backup which can be substituted for some, or indeed any, of the devices in the array. Tunable lasers can also provide significant improvement in local wavelength usage so that optical fibre carriers can be used more flexibly in a communications network with less dependence on centralised intelligence.

In communications, it would be desirable to have a source tunable over the low loss or low dispersion bandwidth windows of an optical fibre for communication. Long distance communication is generally centred on 1310 nm and 1550 nm. In short distance communications such as Local Area Networks (LANs), the equivalent bandwidth window might be centred on 650 nm or 850 nm.

Single mode semi-conductor lasers have been used as tunable sources. For instance, distributed feedback (DFB) lasers have been used but have had a limited tuning range, of the order of 15 nm. This reduces their usefulness in communications. For instance, the International Telecommunications Union (ITU) band of optical channels centred nominally on 1550 nm covers a tuning range of the order of 30 nm.

ECL lasers have also been used as tunable sources. One known configuration uses a diffraction grating in the external cavity to filter a selected wavelength for feedback to the lasing cavity. This is the Littrow configuration. The selected wavelength is diffracted back along the same path as it is incident on the grating so that the grating can provide an end facet of the external cavity in the manner of a retro-reflecting mirror. In the simplest case, wavelength tuning is achieved by controlling the angle of the grating to the incident beam axis. This determines the wavelength diffracted back to the lasing cavity and thus the lasing wavelength.

In tunable sources of this general type, in which feedback is provided by reflection or by a diffraction grating operating in reflection mode, "mode hopping" can arise. This is due to the fact that there will be more than one resonant longitudinal mode for the electromagnetic radiation along the optical path in which oscillation is occurring. To prevent mode-hopping, tuning without interruption of the phase of oscillation, or so-called phase-continuous tuning, should be achieved. A way to do that is to keep the number of half-wavelengths in the optical path in the external cavity constant as the wavelength is tuned. There are known techniques to prevent mode hopping.

In the Littrow arrangement, as mentioned above, tuning is achieved by adjusting the position of the grating but this requires great accuracy. Additionally, if there is a risk of mode hopping for instance because the desired tunable range is large enough, this has to be counteracted. The way this has been done is to move the grating to adjust the optical path length at the same time as carrying out tuning. The various moving parts involved in the optical path are difficult to align in manufacture and to maintain through the working life of the laser and the size of the overall configuration can be simply too large for many applications, being in some cases of the order of tens of centimeters.

There are various aspects of existing tunable sources which could be improved. There is a trade-off between tunable range and power. Some lasers can be configured to replace any of the lasers in today's 40-channel wavelength division multiplexed communication systems but they won't sustain very long transmission distances. Other lasers deliver the power but are not tunable over a wide enough range. Manufacturing costs can be high as some tunable sources are at the edge of what can be done in semiconductor technology and reliability and control are often a problem as the characteristics of individual lasers vary and every one then has to be characterised for use.

BRIEF SUMMARY OF EXEMPLARY NON-LIMITING EMBODIMENTS

According to a first aspect of the present invention, there is provided a tunable optical source which comprises:
i) a gain section for use in generating an optical output;
ii) a feedback section to provide optical feedback to the gain section, the feedback section comprising a diffraction device arranged to provide wavelength selection in said optical feedback by diffraction, wherein the tunable optical source further comprises control means for controlling the refractive index of material of the diffraction device to modify said wavelength selection.

A known type of diffraction device will include a diffractive structure such as a diffraction grating. A diffraction grating can be generally described as an optical component that serves to modulate periodically the phase or the amplitude of incident optical radiation. It is usually constructed as a periodic structure in material of a device, for instance a periodic surface relief or an embedded periodic change in refractive index.

Changing the refractive index of material of the diffraction device can be used to change the diffraction grating performance and thus the spectral content of the feedback.

Embodiments of the invention have the ability to provide controllable wavelength selectivity without using moving parts. Manufacture can be relatively simple and reliability is less at risk.

The diffraction device might comprise a reflection or a transmission grating. That is, in use, an incident beam may be diffracted at the diffraction device without passing completely through it (reflection grating) or at least part of the incident beam may be transmitted completely through the diffraction device (transmission grating). In either case, where at least some of the incident beam is reflected, this can be generally described in that the diffraction device has at least one side and is arranged to provide wavelength selection in said optical feedback by diffracting radiation incident on that side back along a path which lies on that same side of the device.

In a preferred embodiment of the invention, the feedback section is an external cavity in relation to the gain section. Hence it may have an end facet for returning radiation emitted by the gain section back to the gain section. The diffraction device can provide a reflecting facet in relation to the external cavity. This reflecting facet might be placed between the gain section and an end facet, to change the path of radiation travelling in the external cavity, for instance to reflect it onto a mirrored end facet. Alternatively, the diffraction device might itself provide an end facet of the external cavity.

The external cavity may be provided in various ways and may comprise, but is not limited to, free space, an optical fibre or other waveguiding device or optical component, or any combination thereof. Where it comprises free space, the diffraction device may be mounted in said free space.

The tunable optical source may further comprise collimating means for collimating optical radiation travelling in the external cavity. This is common practice where the external cavity comprises free space. Where optical radiation incident on the diffraction device, in use, is collimated, the diffraction device extends in a direction which is at least partially transverse to the direction of the incident optical radiation. Although not essential, for most purposes, the diffraction device in an embodiment of the invention will extend wholly across the path of the collimated incident optical radiation. This transverse arrangement is in contradistinction to DFB or DBR arrangements where the optical radiation is waveguided and a grating is generally disposed along the waveguiding direction of a cavity.

Conveniently, the diffraction device will comprise a grating to provide diffraction of incident optical radiation. Gratings of known type can be used.

In order for the diffraction device to control wavelength selection, it is clearly important that the optical path of the radiation undergoing wavelength selection passes through material of the diffraction device. The wavelength is selected by adjusting the diffraction performance of the diffraction device and this is done by changing the refractive index of at least one material in the diffraction device.

There are several known methods for constructing diffraction gratings and these may result in the device being constructed in one material only or being constructed in two or more different materials. Any of these methods can be used with the proviso that the radiation passes through at least one material of the diffraction device whose refractive index can be controlled so as to adjust the diffraction performance. The grating itself may for instance be a surface relief or a volume grating. Material whose refractive index can be controlled to provide wavelength selectivity in the feedback might be the material in which the grating is formed or might be material which lies in a separate but adjacent layer such as a coating layer on a surface relief grating, or indeed both. In order to control grating performance, however, the material will be material through which the optical radiation is incident on the grating.

In a preferred embodiment of the present invention, the diffraction device is arranged in a Littrow configuration with respect to the gain section. There is an entry point where an incident optical beam from the gain section enters the material of the diffraction device whose refractive index is controlled to modify the wavelength (the "controlled material"). That entry point lies in a plane which is normal to the incident beam in use but the diffractive structure of the diffraction device and the entry point are not in parallel planes. Such an arrangement can be relatively simple in design, fabrication and use.

Although the abovementioned entry point might be provided by a surface of the diffraction device, it may also be provided by an interface between one material and another, or indeed just by a position in the diffraction device where the refractive index of the material comes under control. For example, if the refractive index is controlled thermo- or electro-optically, by the use of one or more heaters or electrodes, the entry point might be determined by the position of the one or more heaters or electrodes. It has been found important in making the present invention, to support a simple relationship between the refractive index and wavelength selectivity, that the entry point is normal to the incident beam and hence the temperature or voltage distribution in such an arrangement must generate a change in refractive index which occurs only in a direction parallel to the direction of the incident beam.

Suitable heating arrangements, such as thin film heaters, or suitable electrodes, for use in a diffraction device according to an embodiment of the invention can be fabricated using known techniques such as epitaxy and/or lithography.

As indicated above, in a first embodiment of the invention, the controlled material may be thermo-optic in which control of the refractive index of the material is provided via temperature control. In a second embodiment of the invention, the material may be electro-optic in which control of the refractive index of the material is provided in accordance with the electro-optic coefficient of the material.

Materials which might be used in a diffraction device for use in an embodiment of the invention, whose refractive index can be controlled by the control means, can be selected from (but are not limited to) the group comprising: glasses, photonic crystals, electro-optic polymers, thermo-optic polymers, liquid crystals, organic crystals, semiconductor materials selected from group IV of the periodic table, compound semiconductor materials selected from one or more of the III–V, II–VI and IV–VI groups of the periodic table, and photorefractive materials. A glass material might comprise a "hybrid glass", that is a glass material having both inorganic and organic components.

The tunable optical source may be of known type and may comprise for example a laser diode which is constructed as an edge emitting double heterostructure. Materials which might be used in the gain section for use in an embodiment of the invention need to meet the requirement that the source can be tuned over the required range by means of wavelength selective feedback. Suitable materials can be selected from (but are not limited to) semiconductor materials from the III–V groups of the Periodic Table, such as GaInAsP/InP. Other examples of suitable materials can be selected from the group $Al_{1-x}Ga_xAs$, $In_{1-x}Ga_xAs_{1-y}P_y$, $Al_xGa_yIn_{1-x-y}P$ and $In_{1-x}Ga_xAs$.

According to a second aspect of the present invention, there is provided a diffraction device for providing wavelength selection in optical radiation, the device comprising:
  i) a body of material having a controllable refractive index;
  ii) an entry point to the body of material for an incident beam of optical radiation;
  iii) a diffractive structure; and
  iv) control means for controlling said refractive index, wherein the diffractive structure is arranged to extend at least generally transverse to the optical path of the optical radiation in use of the diffraction device, but non-parallel to said entry point, whereby changes in the controllable refractive index provide said wavelength selection.

Examples of diffraction device suitable for use in embodiments of the invention might comprise a body of material which is a prism, having a triangular or trapezoidal cross section, the prism having a first surface providing the entry point and a second surface carrying the diffractive structure.

One or more heaters or electrodes to control the refractive index of the material of the prism might then be disposed on a facet or facets of the prism but not in the optical path of the incident beam. For instance, the or each heater or electrode might be disposed on an end or side face which might be parallel to the optical path.

The diffractive structure might be provided by a phase or an amplitude grating, for instance as a surface relief grating, or an embedded or volume grating in or adjacent to the second surface.

The grating may in practice be covered in the finished diffraction device by further material and this further material might be used to change or maintain the reflectivity of the grating. For example, the further material might be in the form of a coating. The further material might either have a separately controllable refractive index or it might be subject to the action of the same heaters or electrodes used to control the refractive index of the material of the prism. This use of a further material can avoid for example changes in overall optical performance of the diffraction device that might occur if the grating is exposed to material whose refractive index remains constant when the refractive index of the prism material changes, such as air.

The embedded or volume grating may in practice be adjacent to, even exposed at, a surface of the piece of material it is formed in.

Preferably, a collimating device is provided to collimate radiation received at the entry point. Where the diffraction device comprises a prism, the collimating device might conveniently be constructed as a lens supported by an input facet of the prism. For example, the lens might be a diffractive lens, of the Fresnel type, or a refractive lens constructed as a convex contour. The lens might be constructed in the material of the prism or might be constructed in material which is additional to but mounted on, the prism.

A diffraction device according to this second aspect of the present invention is preferably arranged in a Littrow configuration with respect to the gain section, in use, and the entry point lies in a plane which is normal to the incident beam.

As in embodiments of the invention in its first aspect, the entry point might be provided by a surface of the diffraction device, by an interface between one material and another, or indeed just by a position in the diffraction device where the refractive index of the material comes under control. Again, it is preferable that the entry point is normal to the incident beam and hence, where the entry point is provided by said position in the diffraction device, any change in refractive index should occur only in a direction parallel to the direction of the incident beam.

A novel aspect of embodiments of the present invention is the use of a diffraction grating "back to front". It is known to use a grating device so that optical radiation is incident directly on the grating. The material which carries the grating is disposed either entirely or mostly behind the grating with respect to an incident optical beam. This is done to reduce or avoid for instance optical losses in the material. In a relatively simple form of an embodiment of the present invention, a diffraction grating device is used which is arranged so that material which carries the grating is disposed either entirely or mostly in front of the grating with respect to an incident optical beam. In its most simple form, the grating might be formed as a surface relief on a surface of a body of material. In this form, the body of material would be arranged so that the surface relief was on a back face of the body of material with respect to incident optical radiation.

In a third aspect of the present invention, there is provided a tunable optical source which comprises:
 i) a gain section for use in generating an optical output;
 ii) a feedback section to provide optical feedback to the gain section,
wherein the feedback section comprises a diffraction device having a diffractive structure arranged to provide wavelength selection in said optical feedback by diffraction, the diffraction device being arranged in relation to the gain section such that, in use, radiation from the gain section is incident on the diffractive structure through material of the diffraction device.

The diffractive structure may be formed in or adjacent to a surface of a body of material and the diffraction device can then be arranged in relation to the gain section such that, in use, radiation from the gain section passes through the body of material, or substantially through it, to the diffractive structure. The diffraction device may be mounted in free space and such that the diffractive structure extends primarily in a direction which is transverse to the direction of radiation incident on the diffractive structure in use.

The feedback section of a tunable optical source in an embodiment of the invention might comprise means for modifying optical characteristics of radiation travelling in the external cavity. This might be one or more of devices such as waveplates, filters or apertures for instance. It may be advantageous that the feedback section comprises optical path control means for controlling the length of the optical path of radiation in the feedback section. This can be used for example to avoid mode hopping. For instance, the optical path control means might comprise a material whose refractive index is modifiable and the optical source might then include means to modify said refractive index so as to control the length of the optical path of radiation in the feedback section. Although other configurations could be used, where the optical path control means is moved to control the optical path, such as a rotatable Fabry-Perot etalon, an arrangement in which the refractive index is modified lends itself to use in a tunable optical source in which tuning is achieved without any moving parts.

An optical source according to the invention may comprise an array of two or more tunable optical sources. In such an array, a diffraction device might provide wavelength selection in the feedback to more than one gain section. However, more conveniently, a set of individual diffraction sub-devices might be used to provide wavelength selective feedback to individual respective gain sections. These diffraction sub-devices might be constructed separately or might be monolithically connected to each other.

According to a related aspect of the present invention, there is provided a diffraction device which can be used in a tunable optical source according to the embodiment of the present invention as described above. Such a diffraction device would generally comprise material having a controllable refractive index, diffraction means disposed in or on the material, and control means for controlling the refractive index of the material so as to control wavelength selectivity of the diffraction means.

Although it might be preferable, it is not essential that an embodiment of the present invention is used to provide wavelength selectivity on its own in an optical source. It might be that it is used in conjunction with another technique. For instance, there may be a coarse control over wavelength selectivity provided by a moving part with a diffraction device according to an embodiment of the present invention being used to provide fine tuning.

Embodiments of the present invention can also or alternatively be used to retune the output of an optical source which has drifted over time.

A particularly appropriate use of embodiments of the present invention is in wavelength division multiplexing and in a further related aspect of the present invention, there is provided a wavelength division multiplexing system comprising a tunable optical source or diffraction device according to an embodiment of the present invention.

According to a still further related aspect of the present invention, there is provided a method of selecting the output wavelength or wavelength range of an optical source, the source comprising a gain section and a wavelength selective feedback section, the feedback section comprising a diffraction device arranged to provide at least part of the wavelength selectivity, which method comprises modifying the refractive index of material of the diffraction device so as to modify one or more diffraction characteristics of the diffraction device.

Said method may comprise modifying the refractive index of a first portion of material of the diffraction device so as to modify one or more diffraction characteristics of the diffraction device, and may further comprise modifying the refractive index of a second portion of material of the diffraction device so as to modify reflectivity of the diffraction device.

As well as the aspects of the invention described above, the invention also provides a diffraction device for use in any one or more of said aspects. Further, any feature described in relation to one aspect of the invention may be applied in relation to one or more other aspects of the invention if appropriate.

BRIEF SUMMARY OF THE DRAWINGS

A tunable source will now be described as an embodiment of the invention, by way of example only, with reference to the accompanying figures in which:

FIG. 7 shows schematically an array of tunable optical sources, each generally configured as shown in FIG. 1A, having individual respective sub-diffraction gratings; and FIG. 8 shows a contour plot of wavelength tuning ranges achievable in a tunable optical source by means of different temperature changes.

It should be noted that none of the dimensions shown in the figures, such as the dimensions of components or their relationships, is to scale. These figures are schematic only.

DETAILED DESCRIPTION OF EXEMPLARY NON-LIMITING EMBODIMENTS

1. Diffraction Device: General Configuration

Figure 1A:
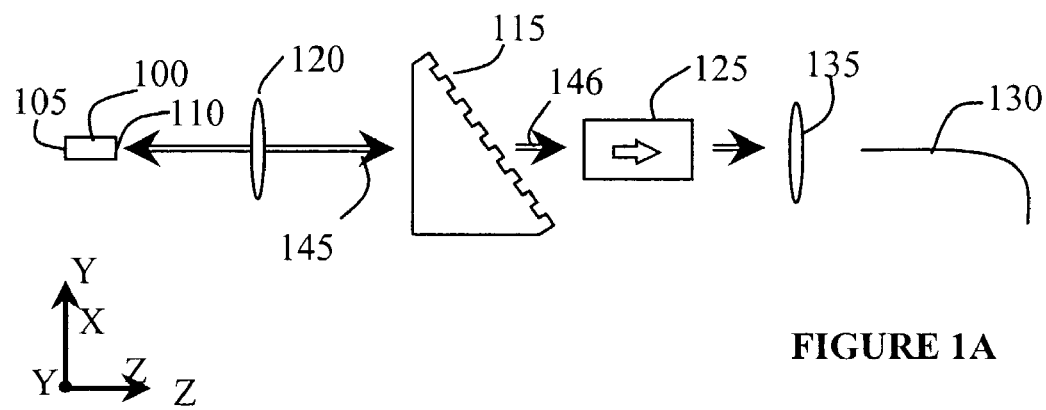
FIGS. 1A and 1B show schematically two external cavity configurations for tuning the output wavelength of an optical source.

Referring to FIG. 1A, an external cavity optical source according to an embodiment of the present invention comprises a semiconductor laser diode 100 which in use emits electromagnetic radiation into an external cavity with an end facet provided by a diffraction device 115 which comprises a grating operating in reflection mode. The laser 100 has an end facet with high reflectivity 105, provided in known manner, and an end facet with low reflectivity 110, also provided in known manner, for emitting electromagnetic radiation into the external cavity. The laser diode 100 is selected to have a wide gain spectrum in a desired wavelength range and in this example is selected to operate over a range centred on 1550 nm. This is one of the windows within which optical fibres are suited to carry communications signals. Examples of alternatives would be lasers tunable over wavelength ranges centred on 650 nm, 850 nm and 1310 nm, also used in communications. Other spectral regions will also be of interest, for instance for non-communication applications.

Any appropriate laser type could be used but a basic requirement is of course that it should be tunable over the necessary range by means of wavelength selective feedback. An example of a laser diode 100 type known for use over wavelength ranges centred on 1310 nm and 1550 nm is an edge emitting double heterostructure, using semiconductor materials from the III–V groups of the Periodic Table, such as GaInAsP/InP. Other examples of suitable known materials for use over various wavelength ranges can be selected from the group $Al_{1-x}Ga_xAs$, $In_{1-x}Ga_xAs_{1-y}P_y$, $Al_xGa_yIn_{1-x-y}P$ and $In_{1-x}Ga_xAs$.

The optical radiation from the laser 100 is collimated by a lens 120 in the external cavity before reaching the diffraction device 115 as an input beam 145. The lens 120 also collects the optical feedback from the diffraction device 115, which has acted as a wavelength selective filter, and returns it to the laser diode 100. This provides wavelength selective feedback which can be used to select the wavelength of the optical radiation generated in the laser 100.

The configuration shown in FIG. 1A is a Littrow configuration in which the first order diffraction beam is returned by the diffraction device 115 along the same path as the incident beam 145. This Littrow configuration is one of several alternatives that might be used and reference might be made to "Tunable External Cavity Semiconductor Lasers" by P Zorabedian, published in the "Tunable Laser Handbook" by Academic Press, 1995, edited by F J Duarte, San Diego, Calif., or to "Tunable Laser Diodes" by M-C Amann and J Buus, published by Artech House, 1998, London.

The external cavity in this arrangement extends between the end facet with low reflectivity 110 of the laser diode 100 and a facet of the diffraction device 115 where diffraction occurs. The diffraction device 115 is thus providing a second end facet of the external cavity. The optical length of the external cavity, which can be adjusted if required to avoid mode hopping, is the optical distance between the end facet 110 of the laser diode and the facet of the diffraction device 115 where diffraction occurs. The lens 120 needs to be at a distance from the laser diode 100 equal to its focal length. The length of the external cavity will therefore have to be greater than the focal length of the lens 120. In practice, the length of the external cavity is likely to be chosen according to other factors combined such as the effect it has on output linewidth and packaging considerations. A typical length for an external cavity which could be used would be on the order of from 1 to 3 cms.

The optical output of the source is obtained as the transmitted beam 146, that is a beam which has passed through the diffraction device 115 from one side to another. This output might be used directly in some applications but in the communications arrangement shown, after passing through an optical isolator 125, it is collected in conventional manner by a lens 135 for coupling into an optical fibre 130. The isolator prevents feedback from the fibre 130 towards the source and again is a known component.

Figure 1B:
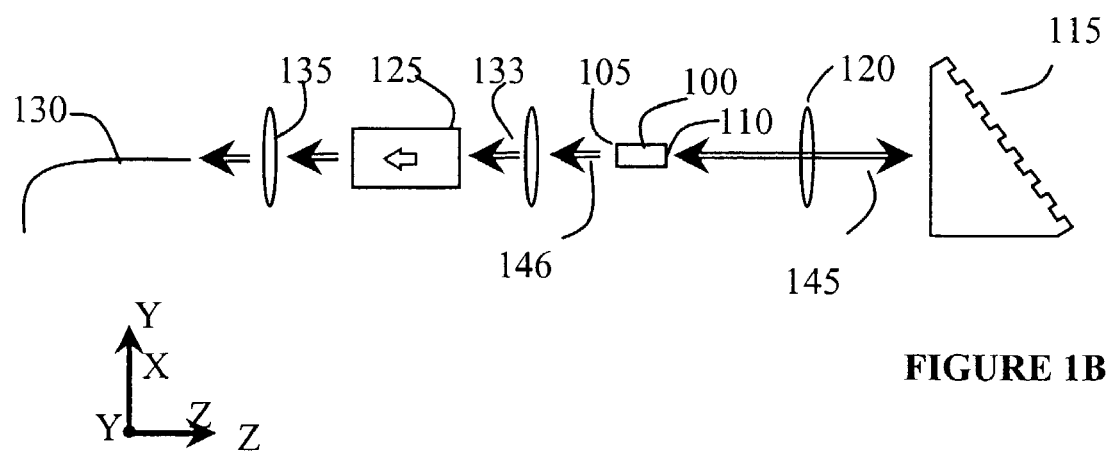

Referring to FIG. 1B, it is not necessary that the optical output be collected from beyond the diffraction device 115. In this arrangement, the output is collected from the end facet 105 of the laser diode 100 which lies away from the external cavity and delivered via lenses 133, 135 and an isolator 125 to a fibre 130. The diffraction device 115 is operating here in wholly "reflective" mode, diffracting incident radiation back to the same side of the device as it was incident without transmitting any portion of it.

Although not shown, other intra-cavity elements may be found useful and embodiments of the invention do not exclude them.

Figure 2A:
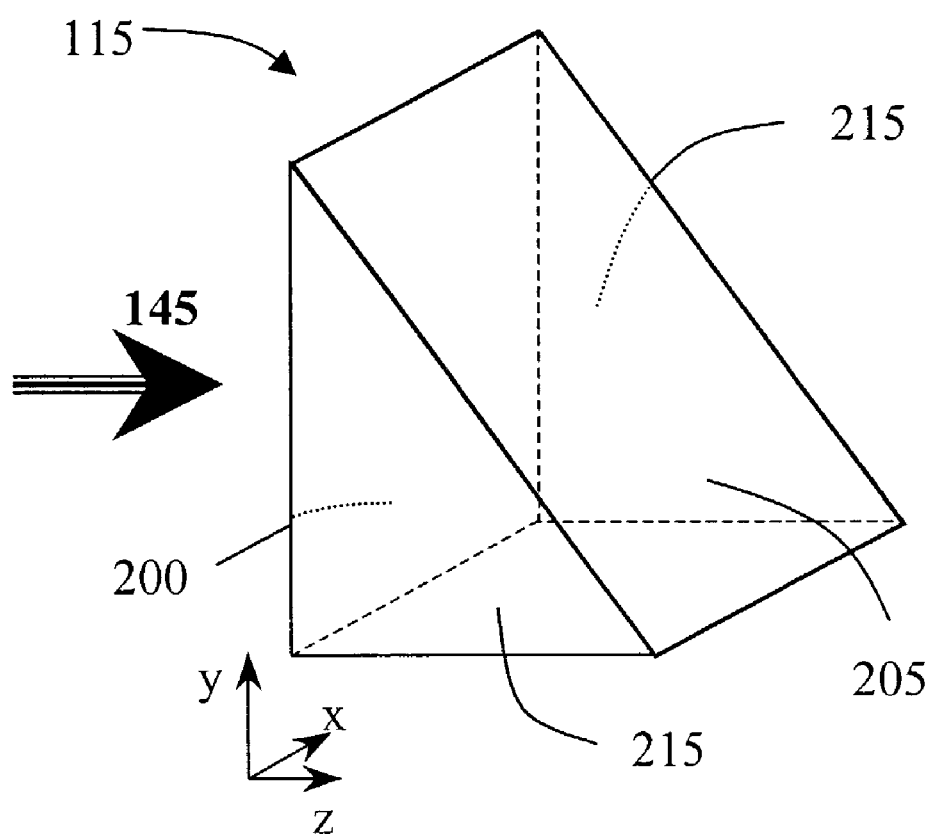
FIG. 2 shows an isometric view of a diffraction device for use in the arrangement of FIG. 1.
Figure 2B:
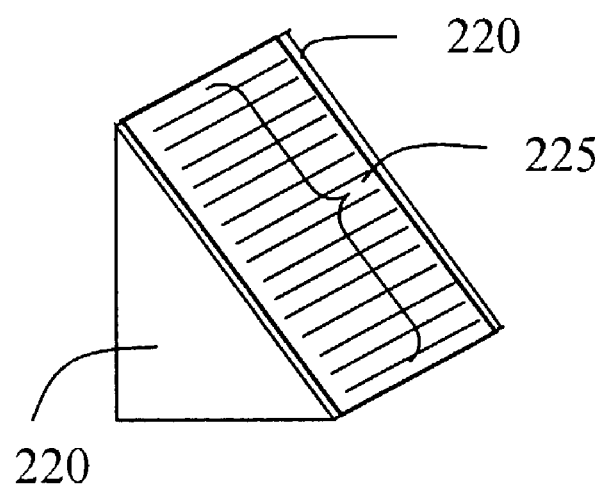

Referring to FIGS. 2A and 2B, the diffraction device 115 itself comprises a prism, optionally referred to herein as a "microprism" in view of its relatively small dimensions, of material having a cross section which is a triangle, in this case right-angled. The incident beam 145 is received at an input facet 200, normal to the beam, and delivered to a diffractive structure 225 on the facet 205 which provides the hypotenuse of the right-angled triangle.

Heaters or electrodes 220 are provided on the side facets 215 of the microprism in a symmetrical arrangement for providing evenly distributed heat or an evenly distributed voltage to the material of the microprism. Depending on the characteristics of the material, this controls the refractive index of the material either thermo- or electro-optically.

Figure 3:
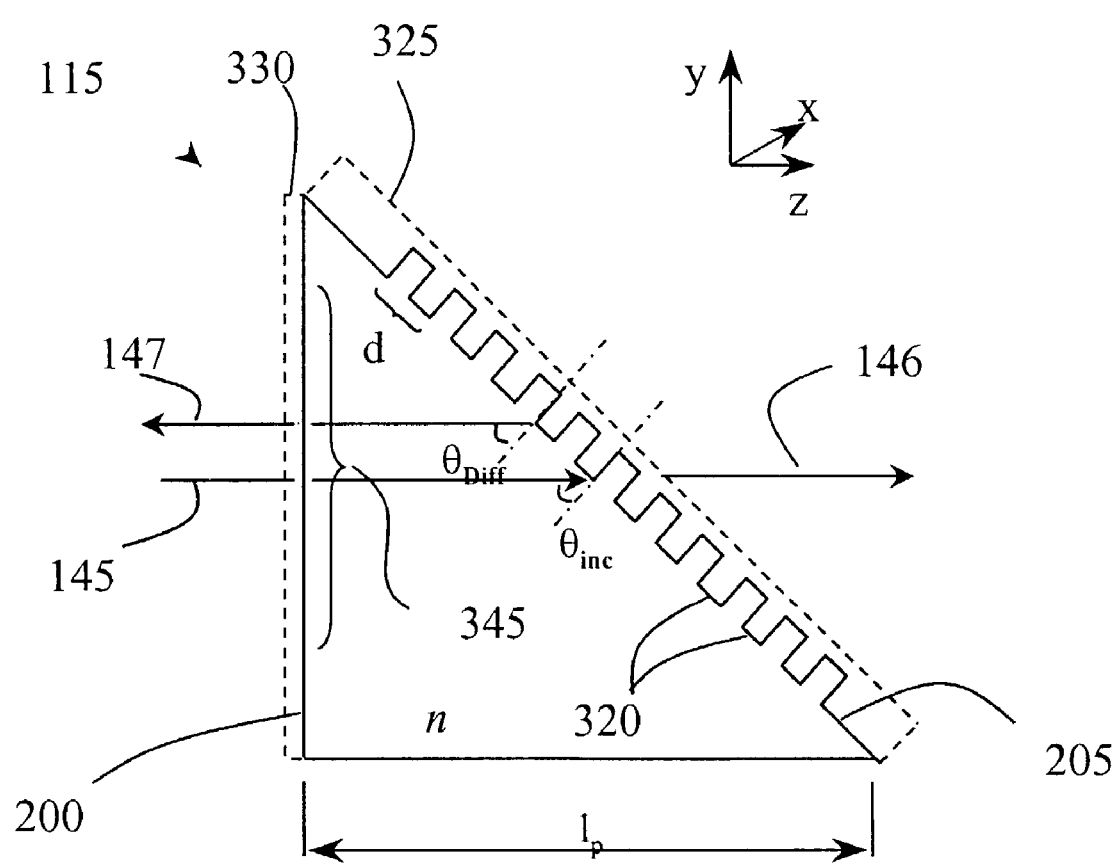
FIG. 3 shows an expanded view of the incidence of optical radiation emitted by a laser diode on the diffraction device of FIG. 2, operating in transmission mode.

Referring to FIG. 3, the manner in which the diffraction device 115 diffracts the optical radiation back towards the laser diode 100 is important. A diffractive structure, in this case comprising a set of grating elements 320 on the "hypotenuse" facet 205, is arranged in a Littrow configuration in relation to the incident beam 145. This means that feedback optical radiation 147 travels back to the laser diode 100 along the same path 145 as it was incident on the diffraction device 115. In order to select the wavelength which is fed back, and thus control the output wavelength of the tunable source as a whole, the refractive index "n" of the material of the diffraction device 115 is controlled. This changes the optical performance of the diffractive structure so that the wavelength of the feedback optical radiation 147 can be modified.

It might be noted that it is not essential that the cross section of the prism of the diffraction device 115 is based on a right-angled triangle. The lowermost facet shown in FIG. 3 for example is not directly involved in the optical feedback mechanism and might be at any of various angles with respect to the other facets. Indeed this lowermost face as shown is not necessarily planar, although it is likely to be simpler to fabricate if it is planar.

The diffractive structure 225 is fabricated as a surface relief on the microprism surface 205 and may be subsequently bonded to or overgrown with a coating layer 325 to control reflectivity. For example, a coating layer 325 might be preselected to produce a reflection coefficient at the diffractive structure 225 which meets a desired target over a range of use of the microprism.

The refractive index of the coating layer 325 might be controllable independently of the refractive index of the main body of the diffraction device 115. This latter arrangement is further discussed below with reference to FIG. 4B. Suitable materials and fabrication techniques for coating layers 325 are known which could be used or adapted for this purpose. For example thermo-optic and electro-optic materials such as those disclosed in this specification might be used.

Alternatively, the coating layer 325 might have a different refractive index but a substantially similar response to temperature change or electrical control as the material of the microprism. It could then be subject to the action of the same heaters or electrodes 220 in order to maintain a substantially constant reflection coefficient at the diffractive structure 225. Again alternatively, it might have a different response to temperature change or electrical control and thus produce a predefined pattern of behaviour in the reflection coefficient.

The front facet 200 of the diffraction device 115, or whichever surface optical radiation enters the device 115 through in use, might also be provided with a coating 330, for instance of known type for anti-reflection purposes.

Figure 4A:
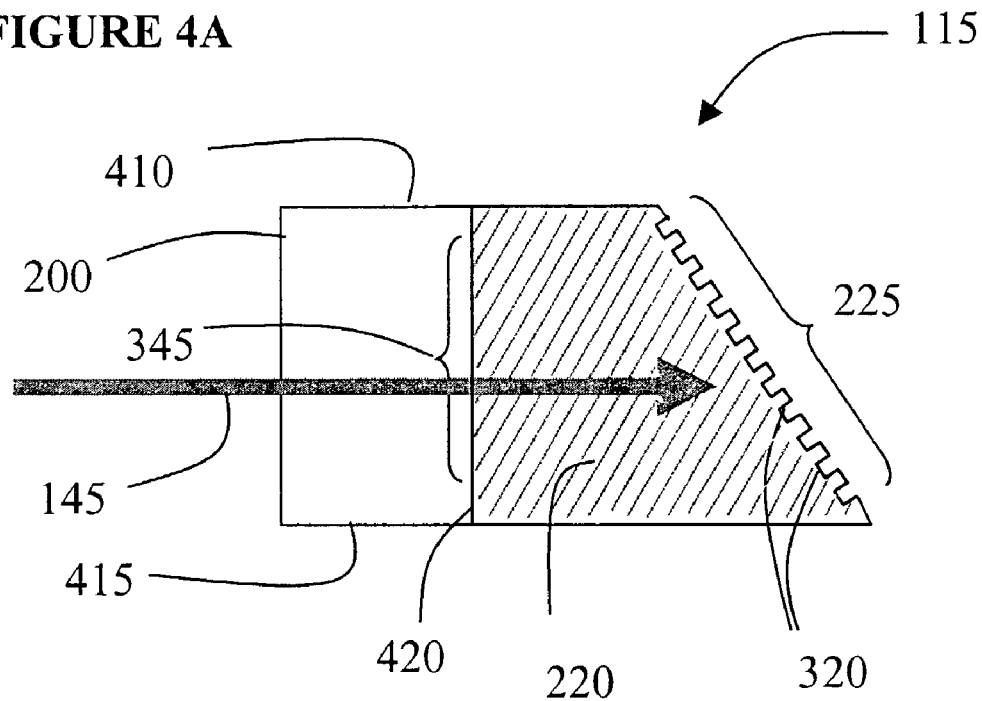
FIG. 4A shows a trapezoidal version of the diffraction device of FIG. 3.

Referring to FIG. 4A, in an alternative arrangement the cross section of the microprism might be that of a truncated triangle, or trapezium. The diffractive structure 225 is disposed on the rear facet with respect to an incident beam 145. Although the heaters or electrodes 220 are again best provided on the side facets 215 of the trapezium, in a position equivalent to that shown in FIG. 2B, it might be noted that they do not necessarily extend the full length of the diffraction device 115 in the direction of the incident beam. It is important in the embodiment described here though that the change in refractive index they produce in the material of the diffractive device 115 in use is evenly distributed across the XY plane and only varies, if at all, in the "Z" direction, parallel to the direction of the incident beam 145.

Other configurations of heater or electrode 220 may be found beneficial in different circumstances. For instance another shape might be found more effective in creating an even distribution of refractive index in the diffraction device 115.

Figure 4B:
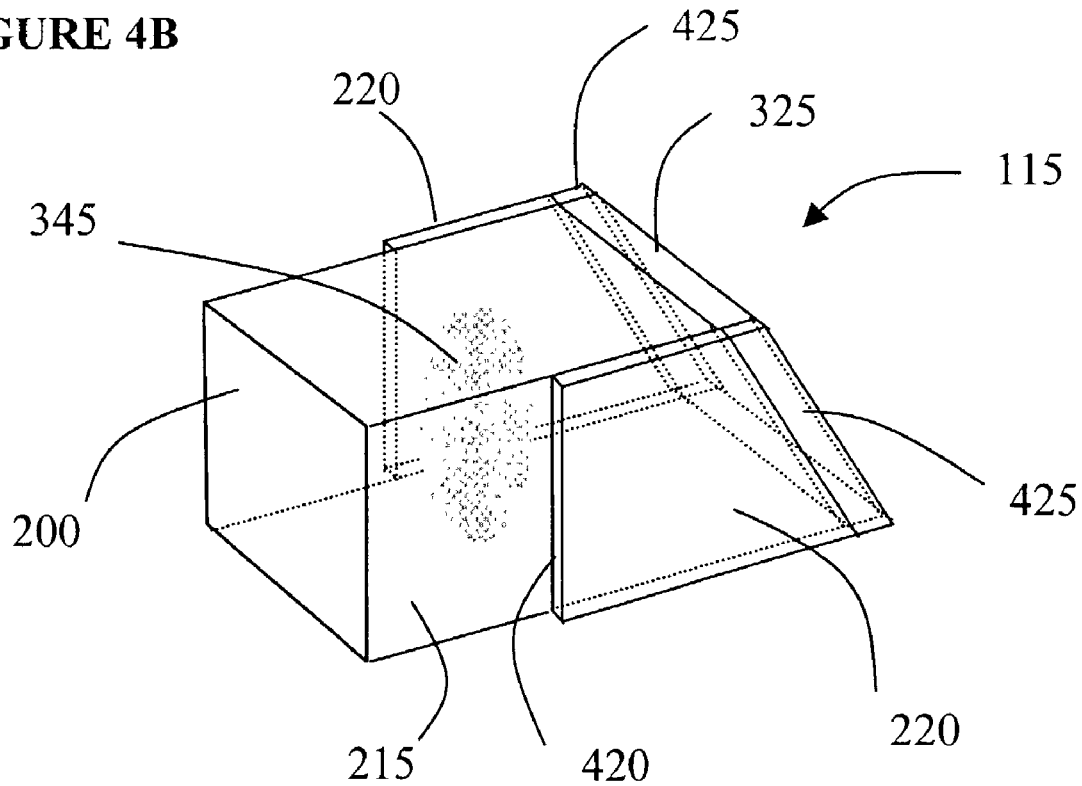
FIG. 4B shows a three quarter view of a trapezoidal version of the diffraction device of FIG. 3.

Referring to FIG. 4B, where a coating layer 325 of significant thickness is used over the diffractive structure 225 (not shown in FIG. 4B), its refractive index can be controlled by a second pair of electrodes 425, independently of the refractive index of the main body of the diffraction device 115. This can be used to modify the reflectivity of the diffractive structure 225 and thus the balance between a feedback beam 147 and a transmitted beam 146. Firstly, this coating might be used for example to counteract a change in reflectivity of the diffractive structure 225 which would otherwise occur in air when the refractive index of the material at the diffractive structure 225 is modified to select a different feedback wavelength. Secondly, this coating might be used more generally to change the balance between the feedback beam 147 and the transmitted beam 146 as required.

(Although not shown, the two pairs of heaters or electrodes 220, 425 will generally need to be separated by insulation material if they are to be independently operable.)

Figure 5:
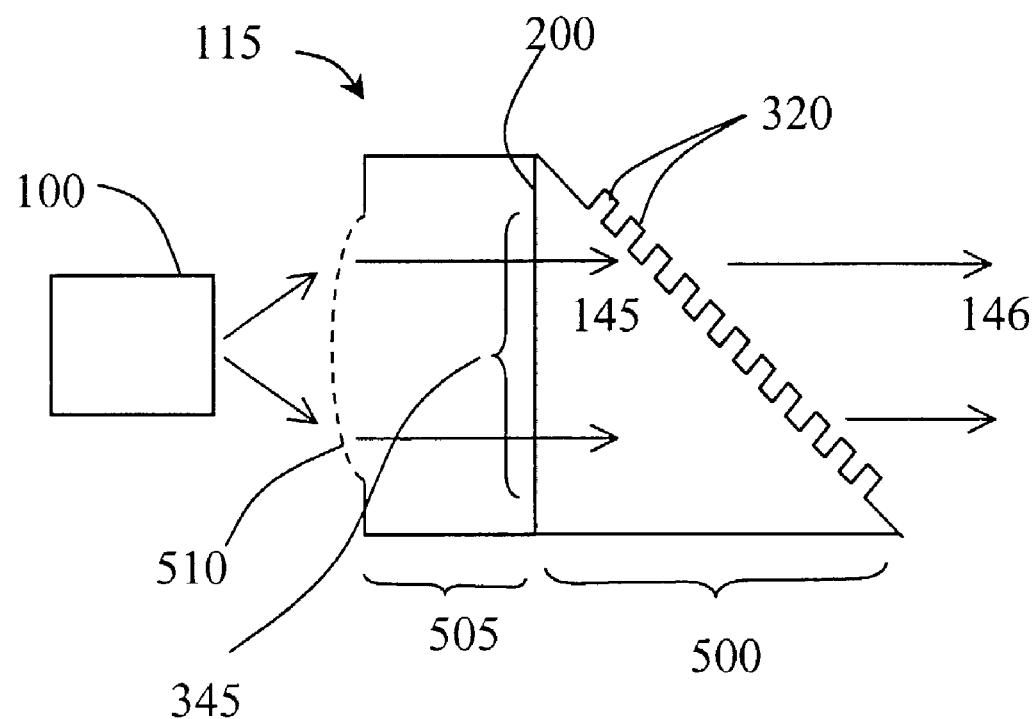
FIG. 5 shows the diffraction device of FIG. 3 with an integrated lens.

Referring to FIG. 5, in a further alternative arrangement the diffraction device 115 comprises a microprism of material 500 with controllable refractive index together with a lens carrying portion 505 of material of constant refractive index. The lens carrying portion 505 is mounted on the input facet 200 of the microprism in order to collimate incident radiation 145 emitted by the laser 100. The distance between the lens 510 and the end facet of the laser 100 is necessarily the focal length of the lens 510.

The lens-carrying portion 505 can be made of ordinary optical quality glass with $dn/dT \sim 1*10^{-5}$ while the microprism 500 can be made of a hybrid glass (further discussed below) with $dn/dT$ of the order of $-30*10^{-5}$. Thus the lens 510, whether it is defined by a curved refractive surface as shown in FIG. 5 or by a diffractive surface such as a Fresnel lens, will be only marginally affected when the microprism 500 is heated to achieve tuning.

The diffraction device 115 is positioned in such a way that its lens is axially aligned with the incident beam 145. Typical dimensions for the lens might be:

focal length in the range 0.5 to 2.0 mm
clear aperture diameter about 2 mm or so
numerical aperture NA~0.5

Lenses of these dimensional characteristics are commercially available, for instance as products of LightPath Technologies Inc. However, an example of a technique to fabricate such a lens on a diffractive device 115 for use in an embodiment of the present invention is moulding, whether the lens is of refractive or diffractive type.

In this arrangement, heaters or electrodes (not shown) may again be mounted on the side facets 215 of the microprism.

1.1 Entry Point

In all of the arrangements described above, and particularly with reference to FIGS. 3 to 6, the incident beam 145 travels through various portions of diffractive devices 115 having different parts and configurations. However, in each case there is an entry point 345 at which the incident beam 145 enters the material of the diffraction device 115 whose refractive index can be controlled to give wavelength selectivity in the feedback beam 147.

The entry point might lie on a facet of the diffraction device 115, such as the facet 200 receiving the incident beam 145 as shown in FIG. 3. Alternatively, the entry point 345 might lie at an interface between one part of the diffraction device 115 and another part. An example of an entry point 345 being at an interface is shown in FIG. 5 where the entry point 345 lies at the interface between the front facet 200 of the prism 500 and a lens carrying portion 505.

Referring to FIGS. 4A and 4B however, it is important to note that the entry point need not lie at a surface or interface at all. In the configuration shown in FIGS. 4A and 4B, the entry point 345 is simply defined by the beginning of the region of material in which heat, current or voltage is provided in use. Referring in particular to FIG. 4B, the beginning of the region of material is defined here by the plane between the ends 420 of the heaters or electrodes 220 delivering heat or a voltage differential. Thus the entry point 345 here lies part way along the material of the diffractive device 115.

In each of these configurations, the entry point 345 lies in a plane which is normal to the axis of a collimated incident beam 145 and this provides a simple and effective arrangement with direct correlation between the controllable refractive index and feedback wavelength, described below.

1.2 Diffraction Theory

To control the wavelength that is diffracted by the device 115, the refractive index of the body of material carrying the diffractive structure 405 (the "incident medium") needs to be modified. The general equation for diffraction, showing the effect of the refractive index "n" of the incident medium is:

$$m\frac{\lambda_0}{n} = d(\sin\theta_{inc} - \sin\theta_{diff})$$

where $\theta_{inc}$ is the angle of incidence within the incident medium on the grating elements 320

$\theta_{diff}$ is the angle of diffraction within the incident medium at the grating elements 320 m is the diffraction order $\lambda_0$ is the free space wavelength d is the grating period n is the refractive index of the incident medium through which the incident and diffracted beams are travelling If the first order of diffraction is being considered, in the Littrow configuration, and the incident and diffracted beams follow the same optical path, this resolves to:

$$2dn \sin \theta_{inc} = \lambda_0$$

In either case, it can be seen that the refractive index n and the wavelength $\lambda_0$ which travels back to the laser diode 100 have a direct relationship and control over "n" gives control over "$\lambda_0$" and thus over the output wavelength of the overall assembly shown in FIGS. 1A and 1B.

The diffraction device 115 is shown in FIGS. 2 to 5 as being disposed so that the input facet 200 of the microprism is perpendicular to the incident radiation 145. $\theta_{inc}$, the angle of incidence within the incident medium on the grating elements 320, is thus the same as the angle between the facet 205 containing the grating surface and the input facet 200. As shown, $\theta_{inc}$ is approximately 45.

This angle $\theta_{inc}$ can be varied subject to the shape of the diffraction device 115. Higher values of $\theta_{inc}$ can lead to difficulties with the device construction; on the other hand it can improve the spectral resolution, $\delta\lambda_0$, of the diffraction device 115, and thus the resolution of the tunable optical source as a whole, according to:

$$\delta\lambda_0 = [\lambda_0^2 \cot(\theta_{inc})]/[2nW]$$

where $\lambda_0$ is the free space wavelength to which the source is currently tuned W is the width of the incident beam $\theta_{inc}$ and n are as given above.

In a diffraction device 115 fabricated in lithium niobate, for example, a spectral resolution as low as 0.05 nm can be achieved at grazing angles of incidence for a several millimeter wide incident beam at 1550 nm wavelength.

Figure 6:
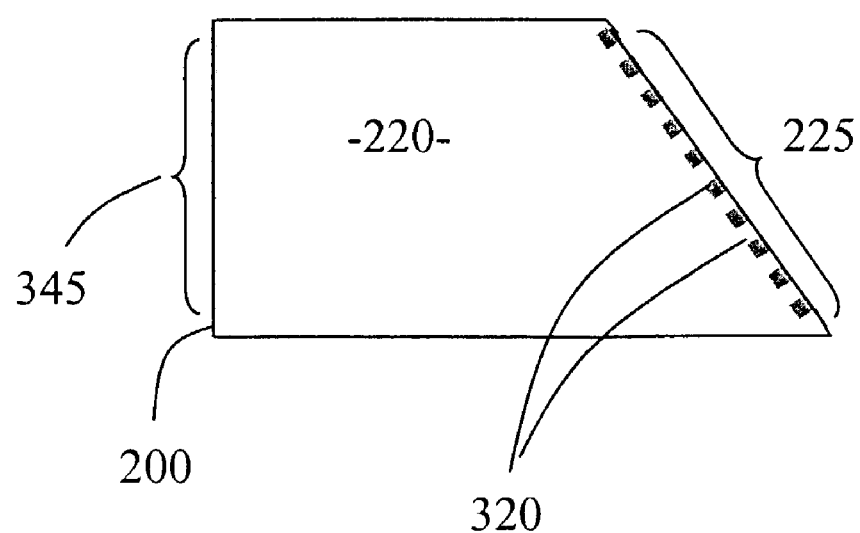
FIG. 6 shows a trapezoidal version of a diffraction device for use in the arrangement of FIG. 1 with an embedded grating in place of a surface relief grating.
Figure 1A:
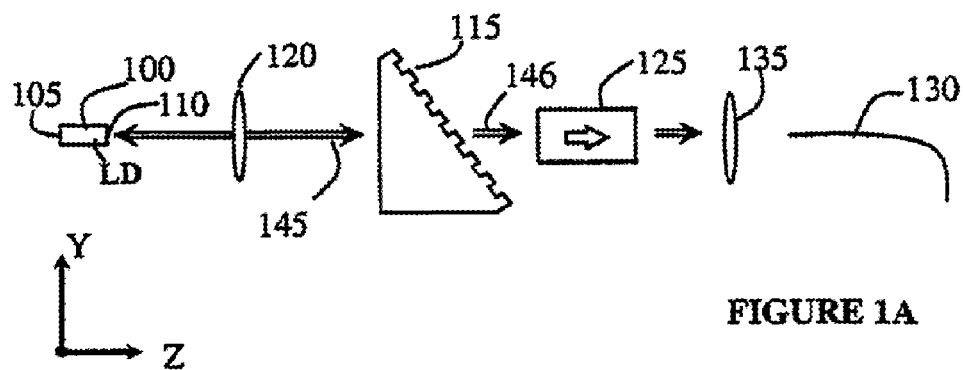
Figure 1B:
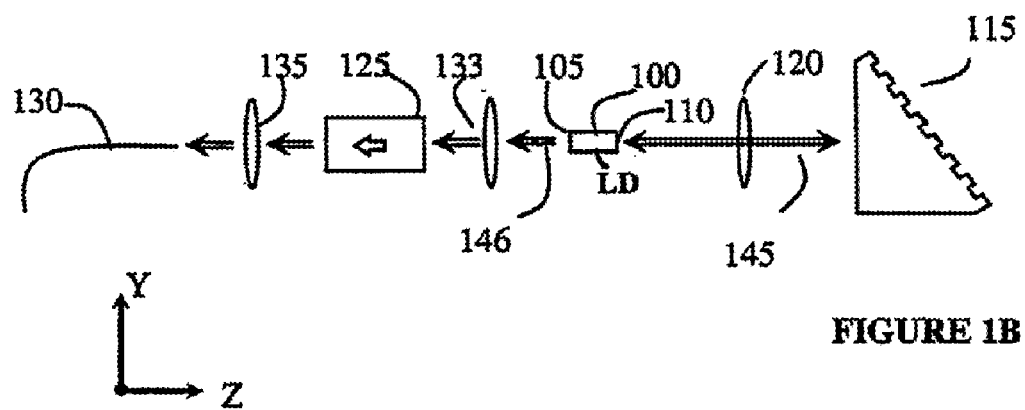
Figure 3:
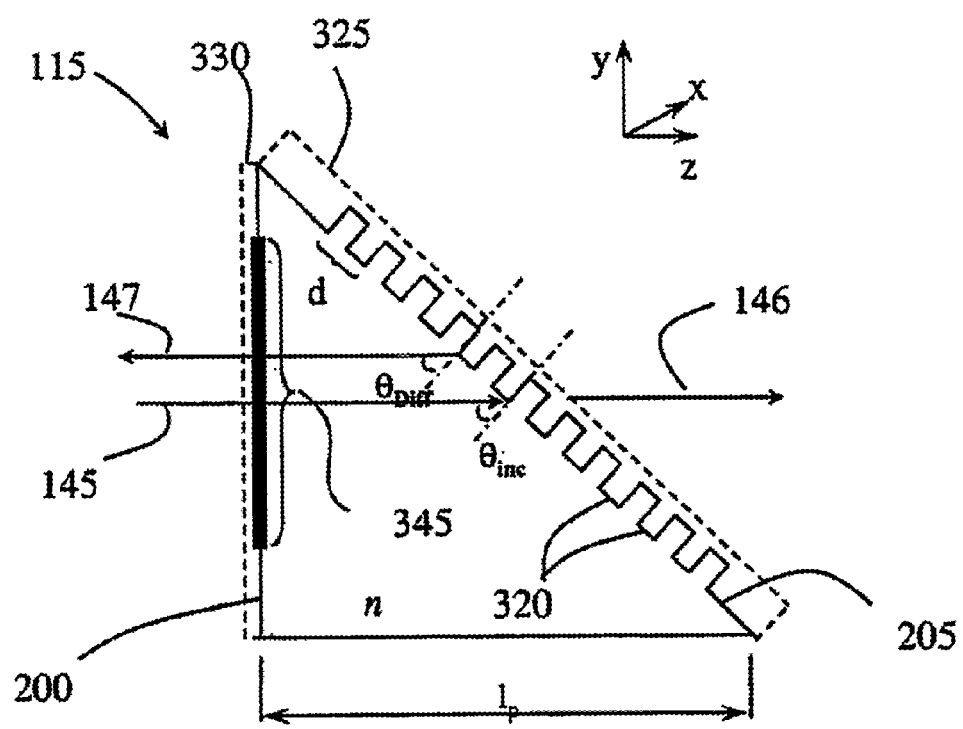
Figure 4A:
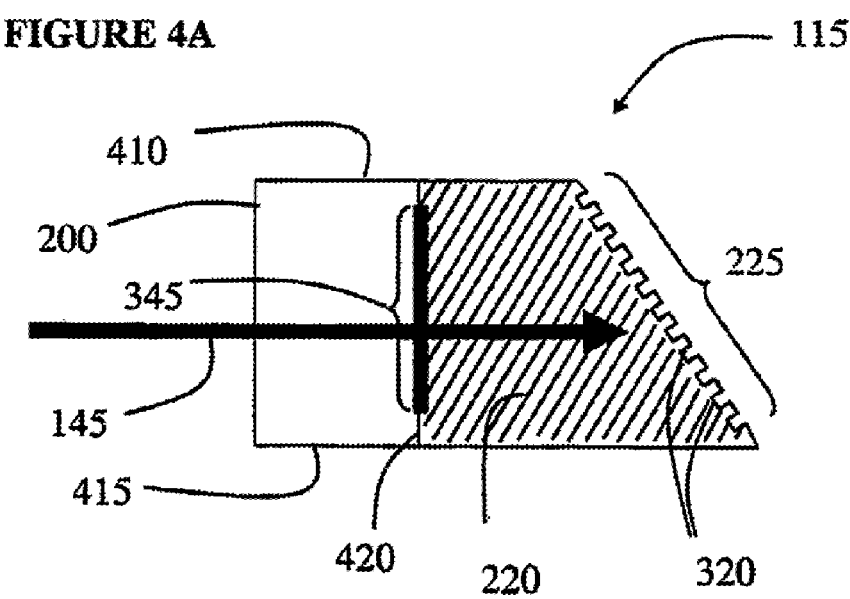
Figure 4B:
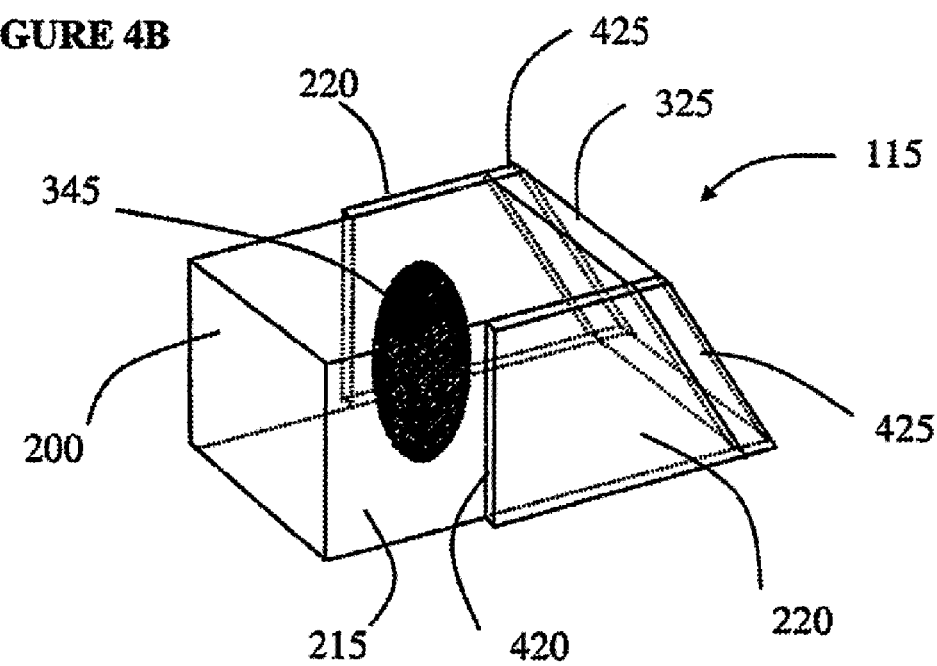
Figure 5:
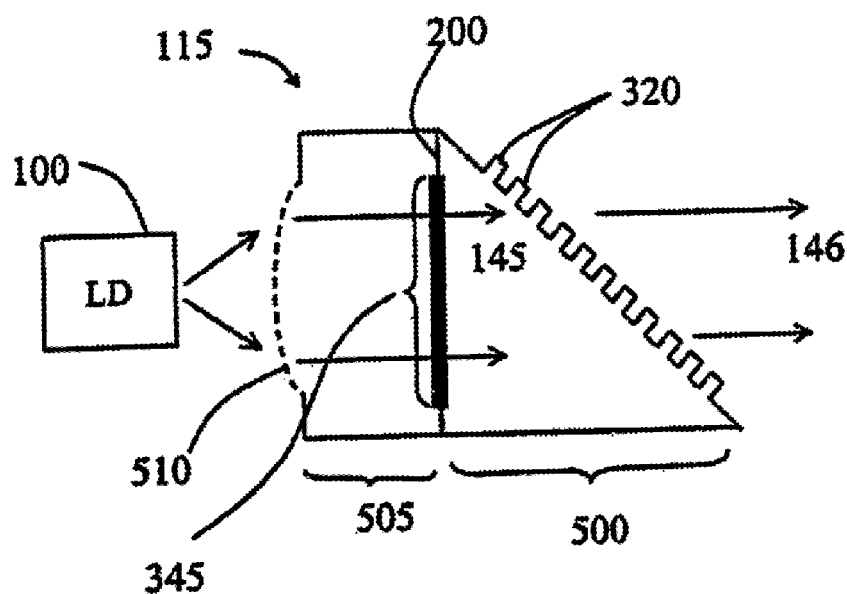
Figure 6:
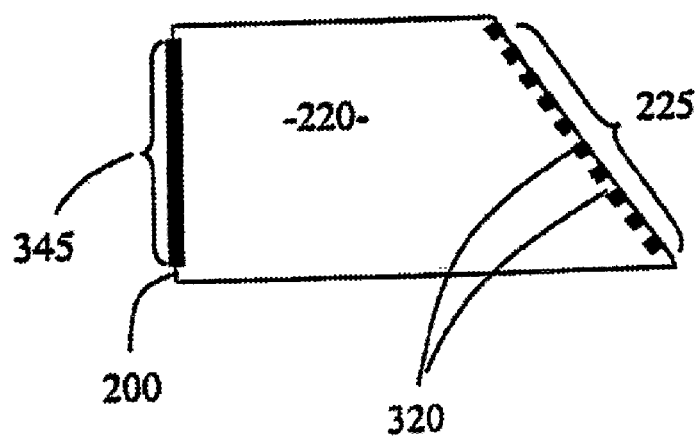

The surface relief gratings described above are conventional binary gratings but other forms can be used, including either phase or amplitude diffraction gratings. Referring to FIG. 6, a known alternative form of grating which can be used is a volume grating, where the diffractive elements of the grating might be formed with a different material from that of the material of the diffractive device 115 and embedded. Further alternative grating types include blazed and kinoform (multistep) gratings.

There are many published texts available on diffraction grating theory and fabrication. Examples are the Diffraction Grating Handbook published by the Richardson Grating Laboratory, fourth edition (2001), "Diffraction Gratings and Applications" by E Popov and E G Loewen, "Digital Diffractive Optics: an Introduction to Planar Diffractive Optics and Related Technology" by B Kress and P Meyrueis, and "Selected Papers on Diffraction Gratings" from the Milestone Series, volume MS83, published in 1993, edited by D Meystre. Various volume holographic gratings are disclosed in the journals Applied Optics (Balberg et al, volume 37, No. 5, 1998 for example, and Pesach et al, volume 39, No. 5, 2000) and Optics Letters (Pesach et al, volume 23, No. 8, 1998).

It might be noted that FIG. 6 shows a further variation of the diffraction device 115. It is based on a trapezoidal prism, in the manner of the diffraction device 115 shown in FIG. 4, but the entry point 345 lies at the front facet 200 of the prism, facing the gain section (not shown). This version of the diffraction device 115 can be produced by using the arrangement of FIG. 4 but extending the heaters or electrodes 220 to cover the whole surface of the side facets 215 of the prism.

2. Arrays

Referring to FIG. 7, there can be significant advantages in providing an array 700 of laser diodes as tunable optical sources. The array 700 may be linear or two-dimensional and it may be monolithic or integrated from separate laser sources. If it is monolithic, the laser diodes will usually have substantially the same optical characteristics, differences being defined only by imperfections of the laser fabrication process.

Referring to FIG. 7, in an array 700 in which the laser diodes are all the same, or almost the same, as each other in optical terms, they may be tuned using a set of individual diffraction sub-devices 115a to 115n—either separate or monolithically connected to each other. Although not essential, the entry points of some or all of the diffraction sub-devices may be aligned in one plane.

Where a set of monolithically connected sub-devices are used, these can be considered and manoeuvred as a single diffractive device 115 which can be mechanically advantageous particularly in assembly and alignment.

This type of array might be useful, for example, in achieving higher power outputs than would be achievable using a single laser diode, or might be used to produce a spatially spread signal source, or might be used to provide multiple signal sources for coupling into a plurality of separate optical fibres.

Such an array may be used as a wavelength division multiplexing source. Individual diffraction sub-devices 115 are driven by separate sets of electrodes and potentially have different respective characteristics for tuning purposes. Any one of the elements of the tunable laser source can be tuned or retuned to a different output wavelength as required or can be individually retuned to compensate for changes in performance over time.

As shown in FIG. 7, the diffraction device or devices can be operated in a partially transmissive configuration, the tuned output 146 being collected from the far side of the device(s) with respect to the external cavity. This is not however necessarily the case as discussed above with respect to the single laser diode configuration shown in FIG. 1B.

The optical arrangement for each laser diode in an array 700 can be seen to be the same or substantially the same as it is for a laser diode operating singly and as described above in relation to any of FIGS. 1 to 6. A dotted outline "B" is shown in FIG. 7, this picking out the optical path and related elements for an individual laser diode in the relevant array.

Referring to FIG. 7 in more detail, a linear or two-dimensional array 700 of laser diode sources can be used, with the reflectivities of the individual laser diodes' end facets 105 and 110 provided in known manner. A linear or two-dimensional array of lenses 120 delivers collimated beams from the laser diode array 700 to the diffraction devices 115, consisting of the set of individual diffractive devices aligned such that their entry points are positioned along a single plane. The output beams 146 are collected after transmission through the diffraction device 115, and may then be delivered as required, for instance to an array of optical isolators and fibres or to a single fibre for high power output (not shown) or used in a multiplexing system of some sort.

Each diffraction sub-device 115 may be separately controllable to change the refractive index affecting the feedback wavelength 147 to its respective laser diode in the array 700 and the diffraction devices 115 may have different grating periods so that the grating period of the diffraction device 115 for the "j"th diode in the array will be $d_j$. In this arrangement, the general equation for diffraction:

$$m\lambda_j = nd_j(\sin\theta_i - \sin\theta_d)$$

can be satisfied differently for different diodes in the array. This means that the array 700 can potentially provide a set of tunable optical sources providing a set of output beams 146 which have wavelengths in any required combination from all the same, through some the same and some different, to all different.

Delivery to a single fibre, or to a smaller number of fibres than there are sources, can be done for instance using fibre-couplers and micro-lenses. A multiplexing arrangement can be achieved using an array of micro-electro-mechanical system (MEMS) mirrors to control the optical path of radiation from sources to fibres.

It is also possible that all the diffraction sub-devices 115 in an array 700 are under common control to change the refractive index affecting the feedback wavelength 147 to its respective laser diode in the array 700. In this case, simultaneous and synchronous tuning of all the elements of the laser diode array 700 can be achieved, thus providing a multiple output tunable external-cavity laser diode system.

In a further alternative configuration, the arrays of FIG. 7 could be arranged so that the diffraction devices 115 operate entirely in a "reflective" manner, as described above with reference to the diffraction device 115 shown in FIG. 1B.

3. Materials and Dimensions

Various materials and dimensions can be used for construction of the gratings and electrodes. Examples of suitable materials and dimensions for the grating and electrodes are discussed further below.

There are alternative methods for controlling the refractive index "n". It can be done thermo-optically, by applying a temperature differential to the material used in constructing the diffraction device 115, or electro-optically by applying a voltage to the material. In each case, electrodes can be used to apply an input, via heaters or directly, to the diffraction device 115 which will alter the refractive index "n" appropriately.

It is necessary that the material used is selected to meet certain requirements. It has to be transparent over the desired tunable range and, importantly, its refractive index "n" must be controllable through a range appropriate to produce a desired wavelength selectivity in the optical source as a whole, using a practical construction and electrical control parameters.

3.1 Materials and Dimensions: Thermo-Optical Tuning 3.1.1 Thermo-optic Materials Examples of materials which can be used in a diffraction device for thermo-optic tuning are:

hybrid glass with a thermo-optic coefficient of the order of $-30\times10^{-5}$ optical silicone resin which can have a dn/dT (where T is temperature) of approximately $-50-10^{-5}$ optical epoxy which can have a thermo-optic coefficient of approximately $-100$ to $-200\times10^{-5}$.

As a reference the thermo-optic coefficient of silica is $1.1\times10^{-5}$.

Optical silicone resin and epoxy are known materials but hybrid glass materials are a relatively recent development. A "glass material" in this context is used in the usual way to mean an amorphous or non-crystalline solid. References to a "hybrid glass material" and the like are intended to refer to a glass material having both inorganic and organic components. This makes it possible to select a glass material which has one or more particular properties.

In the glass material, an inorganic matrix can be provided at least in part by any metal alkoxide or salt that can be hydrolysed, all of these being appropriate inorganic network formers, including those based on groups 3A, 3B, 4B and 5B of the Periodic Table, such as silicon dioxide, aluminium oxide, titanium dioxide and zirconium oxide. Functional organic components can then be used to modify the inorganic matrix. In general, the glass material of the substrate-based assembly will preferably include an organic component which polymerises by cross-linking. It might for instance be an organic component which polymerises under thermal or photo treatment, such as the functional hydrocarbon compounds comprising acrylates, epoxides, alkyls, alkenes, or aromatic groups which support photopolymerisation.

References to hybrid glass materials can be found for example in the following publications:

A. H. Karkkainen et al, Applied Optics, v.41, pg. 3988, July 2002

"Fabrication of Micro-Optical Structures by Applying Negative-Tone Hybrid Glass Materials and Greyscale Lithography", by A. H. O. Kärkkäinen, J. T. Rantala, M. R. Descour, published in Electronics Letters, Vol. 38, No. 1, pp 23–24 (2002)

"Siloxane-Based Hybrid Glass Materials for Binary and GrayscaleMaskPhotoimaging",byA.H.O.Kärkkäinen, J. T. Rantala, A. Maaninen, G. E. Jabbour and M. R. Descour, published in Advanced Materials, Vol. 14, No. 7, pp 535–540 (2002)

Copending U.S. patent application, assignee Optitune plc, filed of even date with the present application and naming Yakov Sidorin and Ari Kärkkäinen as inventors, the disclosure of which is incorporated herein by reference The relationship dn/dT in hybrid glasses can be adjusted based on the crosslinking density of organic-inorganic components in the material matrix. For instance, increasing crosslinking density in an organo-siloxane matrix decreases the intrinsic dn/dT value of the material. The materials crosslinking density in the organic-inorganic matrix can be raised using two different approaches. A first approach is to increase the molar concentration of tetra functional siloxanes in the matrix, for example by increasing the compositional concentration of precursors that are capable of forming four silicon-oxygen bridges to other silicon atoms. A second approach is to increase the amount of multi-functional organic moieties in the matrix and especially components that are able to undergo organic crosslinking through organic double bond polymerization.

For example, using an organo-siloxane matrix, the intrinsic dn/dT value will be decreased in the hybrid glasses by:

increasing the concentration of tetrafunctional siloxanes increasing the concentration of thermally or radiation crosslinkable organic moieties increasing the concentration of non-organic-moieties containing metal or metalloid components and the intrinsic dn/dT value will be increased by:

increasing the concentration of bifunctional and monofunctional siloxanes increasing the concentration of non-crosslinkable organic moieties If the composition of the material changes then the refractive index of the material will usually change as well. However, this can be compensated by fluorination of the organic moieties.

3.1.2 Diffraction Device Dimensions

The grating features in a diffraction device 115 will typically be dimensioned to be of the order of the wavelengths to be selected. Hence in the optical source for use over a wavelength range centred on 1550 nm, the grating elements 320 will have a period in a range such as 250 nm to 1550 nm.

The overall dimensions of the diffraction device 115 will be selected to suit its purpose but linewidth may be an issue. As mentioned above, the area "W" of an optical beam which is incident on a diffraction grating has an inverse relationship with linewidth. In order to get narrow linewidth for communication purposes, a diffraction device 115 may typically be required to provide a grating having dimensions of the order of 5×5 mm.

This has an effect on the length of the external cavity and thus of the overall tunable source because the beam spot size of the incident beam 145 needs to be expanded from the typical output of a semiconductor laser 100 to something at least roughly matching the dimensions of the grating 405. The overall length of the tunable optical source might be for instance anything in the range from some hundred micrometers up to several centimeters. Also as mentioned above, in practice, the length of the external cavity is likely to be chosen according to other factors combined such as the effect it has on output linewidth and packaging considerations. A typical length for an external cavity which could be used would then be on the order of from 1 to 3 cms.

3.1.3 Heater or Electrode Materials and Dimensions.

Any suitable material could be used for these, such as:

metallic conductors such as gold, titanium, aluminium, molybdenum, nickel and chromium or combinations thereof conductive oxides, at least some of which are transparent at wavelengths likely to be of interest, such as indium tin oxide and doped tin oxides, potentially, polymers such as polyanilene or polythiophene and their derivatives. Heaters may be provided with low resistivity gold pads (not shown) for bonding to external conductors, or other suitable connections.

The heaters or electrodes will typically be several millimeters wide and long when used on facets of the diffraction device 115. Although a single heater could be used, it may generally be found more efficient to use at least two.

3.1.4 Polarisation

Conventional types of surface relief gratings (binary, blazed, kinoform profiles) which might be used in the diffraction devices 115 of embodiments of the present invention will have a blaze angle which is either low, for instance from 5 to 10, or very low, for instance less than 5, while other relief gratings with generally sinusoidal profiles will have zero blazing angle. Classification of angles is given in the Diffraction Grating Handbook (published by Richardson Grating Laboratory).

The diffraction performance of a diffraction device 115 depends on the polarization of the incident light. Transverse electric (TE)-polarized light is polarized parallel to the grating grooves (or other grating elements) while transverse magnetic (TM)-polarized light is polarized perpendicular to the grating grooves. For low and very low blaze angles, TM-polarization is known to result in generally higher diffraction efficiency, with theoretical peak values of 100%, while TE-polarization is diffracted with generally lower efficiency. Hence in embodiments of the present invention it would at least usually be preferable to choose TM-polarization of incident light with respect to the diffraction device, in a direction perpendicular to the grating elements 320.

The polarisation of light leaving a laser diode 100 will usually be determined by the orientation of the laser diode 100.

The preferred mutual orientation of the diffraction device 115 and the edge-emitting laser diode 100 (or laser diode array 1200, 1300) is that the direction of the primary pn-junction(s) in the laser diode(s), that is the direction which crosses the junction from p-doped to n-doped material, is parallel to the direction of the grooves of the grating. That is, if each groove extended in a vertical plane, the direction of the pn junction would be vertical and the plane in which the junction was actually formed would be horizontal. This results in TM polarised radiation being incident on the diffraction device 115 in a direction perpendicular to the grating elements 320.

It is also possible to control polarisation of the radiation after it has left the laser diode 100, for instance by using a waveplate or other polarising device in the external cavity.

3.1.5 Diffraction Order

To maintain diffraction efficiency while keeping the design of the diffraction device 115 relatively simple, it is best to use the first order of diffraction; |m|=1. Operation in higher diffraction orders is possible but may require additional fabrication steps such as coating of the grating surface to enhance the diffraction efficiency.

3.1.6 Diffraction Angle

Diffraction at small angles $\theta_{diff}$, under otherwise equal circumstances, may result in decreased spectral resolution, which is not usually desirable. There will generally be an upper limit on the diffraction angle $\theta_{diff}$ for a diffraction device 115 in a preferred embodiment of the invention: it cannot be extreme, to avoid the loss of optical radiation by total internal reflection within the grating. A typical range might be for example $\theta_{diff}$=20 to 60.

3.1.7 Tuning Range Example

In an example, a thermally tunable diffraction device made of hybrid glass with refractive index n=1.5000 (at a room temperature of 20 Celsius and at a wavelength of 1550 nm) and linear thermo-optic co-efficient $\partial n/\partial T$=−30×10⁻⁵ is used to operate in a $\lambda_0$=1.55 µm spectral window.

Examples of a configuration in which the above material could be used are of the general type shown in FIGS. 1A or 1B, with the diffraction device 115 operating to give first order diffraction in a Littrow configuration. The angular orientation of the diffraction device 115 with respect to the incident light 145 gives an angle $\theta_{inc}$ (as shown in FIG. 3) in the general range from about 20 to about 60 with respect to the normal to the grating. The plane of the pn junction in the laser diode 100 is normal to the plane in which the grating elements 320 extend so as to give TM polarisation in the direction perpendicular to the grating elements 320.

Then, according to( the following relationship (which is easily obtainable from the diffraction equation), it is possible to calculate $\Delta\lambda$ which is the change in diffracted wavelength achieved when a temperature change $\Delta T$ is applied:

$$\Delta\lambda_0 = \frac{\lambda_0}{n}\frac{\partial n}{\partial T}\Delta T$$

where $\lambda_0$ is initial free space wavelength, before a temperature change $\Delta T$ is applied n is the initial refractive index, before a temperature change $\Delta T$ is applied Thus a local temperature change of about 50 would produce a 1% change in refractive index and thus an approximately 1% shift in diffracted wavelength, which would amount to about 15.5 nm in this example. The drive power required to achieve this temperature variation would depend on the material of the heaters/electrodes and their arrangement.

Since there is direct dependence of the shift in diffracted wavelength on local temperature change, using a temperature change of 100 gives a wavelength shift of 31 nm (that is, roughly 0.3 nm per C) and using a lower temperature change, say 33, gives a smaller wavelength shift of the order of 10 nm.

FIG. 8 shows a contour plot of the free space wavelength tuning ranges achievable by varying the temperature of the material adjacent a diffractive structure 225 in an embodiment of the invention.

It will be understood that, in using the above equation, the changes in $\lambda$ and n are so small in percentage terms that the values used for them in the equation can be left at the central values for the ranges involved.

It might be noted that there is a secondary effect of changing the temperature of the material carrying the diffractive structure 225 and this is a dimensional change. However, in most cases this is not significant: for example the coefficient of thermal expansion for the hybrid glass material is of the order of 1×10⁻⁶.

Rather than starting at room temperature, it may be preferred to bring the diffraction device to a selected temperature (for example 50° C.) and then to heat or cool it from there to achieve appropriate wavelength tuning.

It might be noted in this respect that although reference is made in this specification primarily to heaters as temperature control means, it may be appropriate to use one or more cooling devices or heat sinks instead of one or more heaters for applying a temperature change.

3.2 Materials and Dimensions: Electro-Optical Tuning

It will be understood by a person skilled in the art that the following known electro-optic materials are examples of materials which could be used to give refractive index control, and thus feedback wavelength control, in embodiments of the present invention.

Most common photonic crystals may be used, including but not limited to LiTaO$_3$ (lithium tantalate), LiNbO$_3$ (lithium niobate), KH$_2$PO$_4$ (KDP) and CdTe, depending on the spectral region of operation of the diffraction device. Electro-optic polymers such as azo-dye doped polymethyl methacrylate, modified nitroanilines, polythiophenes, liquid crystals, organic crystals such as 2-methyl-4-niroaniline, or photorefractive and/or semiconductor materials could also be used. Examples of semiconductor materials might be selected from group IV of the periodic table, or compound semiconductor materials might be selected from one or more of the III–V, II–VI and IV–VI groups of the periodic table, such as InP (indium phosphide) or GaAs (gallium arsenide). Doped semiconductor materials in particular are capable of carrying charges and are thus electro-optically tunable.

General dimensions of the grating, diffraction arrangements, electrode configuration etc where electro-optic materials are used will be similar to those where thermo-optic materials are used.

4. Phase-Continuous Tuning

Tuning without interrupting the phase of oscillation, or so-called phase-continuous tuning, is realized provided that the number of half-wavelengths, in the overall laser cavity, of the radiation being tuned remains constant during tuning. To achieve this, the longitudinal modes of the radiation in the cavity must be shifted at the same rate as the peak wavelength, $\lambda_{pk}$, of the pass bandwidth of the tuning element, which as described above is the diffraction device 115. This is described by the following condition:

$$\frac{\Delta L_{eff}}{L_{eff}} = \frac{\Delta \lambda_{pk}}{\lambda_{pk}}$$

where $L_{eff}$ is the effective optical length of the external cavity laser.

Fortunately, the nature of TO-tuning can naturally satisfy the equation above so that no mechanical movement has to be utilized. However, there may be effects which change the external cavity length in an unpredictable way, such as transmitted vibration or movement, and it may still be advisable to introduce another controllable element in the cavity to try to minimise these other effects.

5. Fabrication Techniques

Diffraction gratings of most of the types described above are known and can be made using suitable known fabrication techniques such as epitaxy and etching, or by exposure of a photosensitive material of the grating device to UV-light through an appropriate lithographic mask.

Another aspect of fabrication in embodiments of the present invention is the mounting of the components of the source in relation to one another, movably or otherwise. Again, suitable mounting arrangements for components of the optical source are known. Soldering or welding might typically be used. Other available techniques include precision-fabrication of holders with tolerances of the order of micrometers, glueing and thermo-compression with manipulation at nanometer precision. The laser diode and diffraction device may conveniently be mounted on a common substrate such as silicon, quartz, ceramic material, metal, metal alloy or glass. Suitable arrangements are described for example in pending European patent application 02256515.4 filed on 19, Sep. 2002 in the name Optitune plc.

As mentioned above, the feedback section of a tunable optical source in an embodiment of the invention might comprise means for modifying optical characteristics of radiation travelling in the external cavity. This might be one or more of devices such as waveplates, filters or apertures for instance. It may be advantageous that the feedback section comprises optical path control means for controlling the length of the optical path of radiation in the feedback section. This might be used for instance to avoid mode hopping. Such optical path control means might comprise a material whose refractive index is modifiable and the optical source might then include means to modify said refractive index so as to control the length of the optical path of radiation in the feedback section. Although other configurations could be used, where the optical path control means is moved to control the optical path, such as a rotatable Fabry-Perot etalon, an arrangement in which the refractive index is modified lends itself to use in a tunable optical source in which tuning is achieved without any moving parts.

To summarise, embodiments of the present invention are capable of providing a tunable source of optical radiation in which there are no moving parts, the tuning being provided via controlled changes in refractive index of a material of a diffraction device in a phase-continuous fashion.

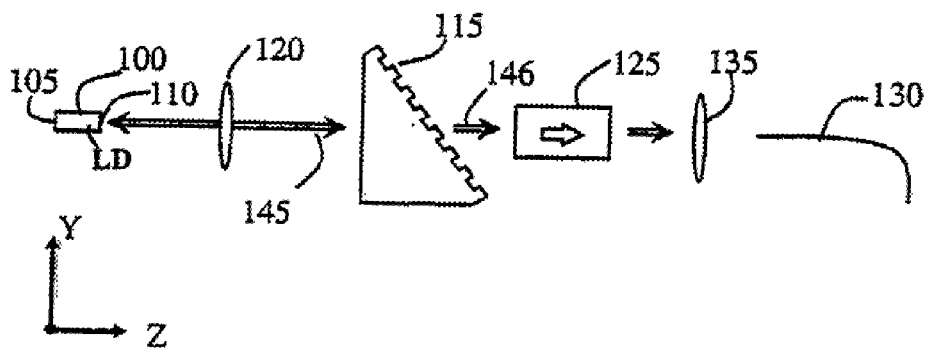

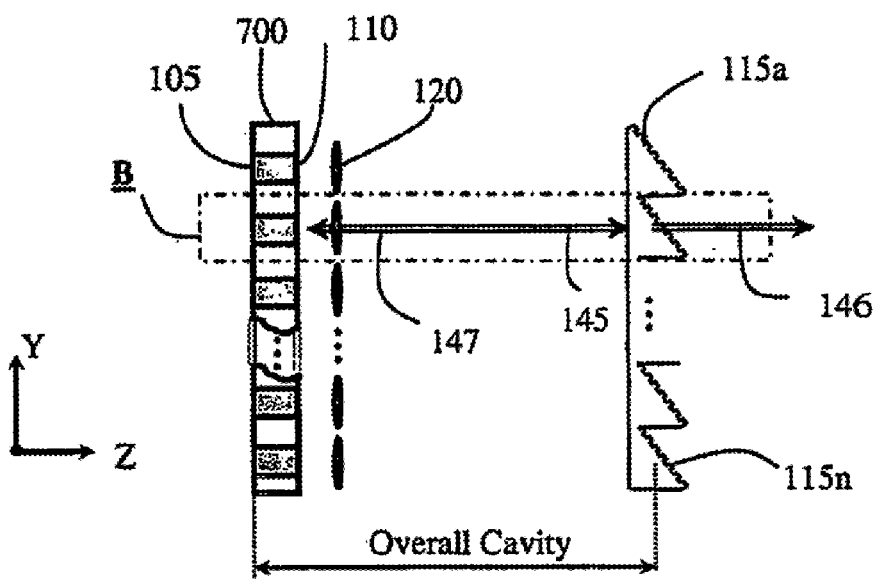
FIGURE 7
FIGURE 8
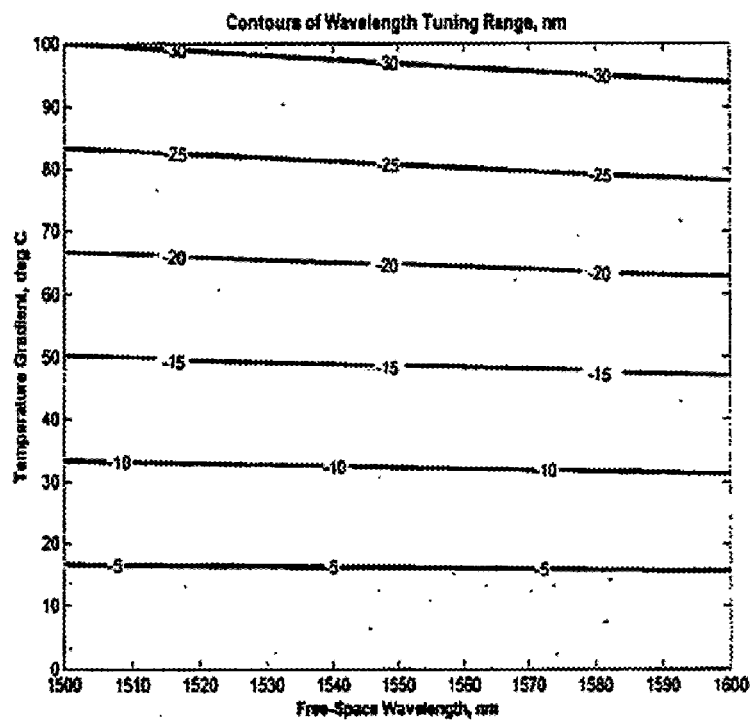

What is claimed is:

1. A tunable diffraction device for providing wavelength selective feedback in a tunable optical source, the tunable diffraction device comprising:
   i) a body of material having a controllable refractive index;
   ii) a planar entry point to the body of material for an incident beam of optical radiation;
   iii) a diffractive structure mounted, in use, in a Littrow configuration with respect to the incident beam; and
   iv) a controller for controlling said refractive index,
   wherein the diffractive structure is arranged to extend at least generally transverse to the optical path of the optical radiation in use of the tunable diffraction device, but non-parallel to said planar entry point, and changes in the controllable refractive index provide said wavelength selective feedback.

2. A tunable diffraction device according to claim 1 wherein the incident beam is incident in a direction normal to the plane of said planar entry point.

3. A tunable diffraction device according to either one of claims 1 or 2 wherein the planar entry point is provided at a surface of the body of material.

4. A tunable diffraction device according to claim 1 wherein the planar entry point is provided at an interface between the body of material and a further material of the tunable diffraction device.

5. A tunable diffraction device according to claim 1 wherein the body of material is at least partly defined by the extent of a controllable electric field in the tunable diffraction device in use.

6. A tunable diffraction device according to claim 1 wherein the body of material is provided as a prism, having a triangular or trapezoidal cross section, the prism having a first surface providing the planar entry point and a second surface carrying the diffractive structure.

7. A tunable diffraction device according to claim 6 wherein said controller comprises one or more control elements to control the refractive index of the material of the prism, said one or more control elements being disposed on one or more facets of the prism which are not in said optical path.

8. A tunable diffraction device according to claim 7, comprising two or more control elements, the two or more control elements being disposed on respective side facets of the prism which are parallel to the direction of the optical path.

9. A tunable diffraction device according to claim 1, wherein the diffractive structure is covered by a further material, the refractive index of the further material being selected or controlled to determine the reflectivity or transmissivity of the grating in use.

10. A tunable diffraction device according to claim 9 wherein the refractive index of the further material is controllable separately from that of the body of material.

11. A tunable diffraction device according to claim 1, further comprising a collimating device to collimate radiation received at the planar entry point.

12. A tunable diffraction device according to claim 11 wherein the collimating device is provided as a lens constructed from material supported by a first surface of a prism which provides the body of material.

13. A tunable diffraction device according to claim 12 wherein the lens is a diffractive lens.

14. A tunable optical source comprising:
   a gain section for use in generating an optical output;
   a feedback section to provide optical feedback to the gain section, the feedback section comprising a tunable diffraction device which provides wavelength selection in optical radiation and includes:
   i) a body of material having a controllable refractive index;
   ii) a planar entry point to the body of material for an incident beam of optical radiation;
   iii) a diffractive structure; and
   iv) a controller for controlling said refractive index,
   wherein the diffractive structure is arranged to extend at least generally transverse to the optical path of the optical radiation in use of the tunable diffraction device, but non-parallel to said planar entry point, and changes in the controllable refractive index provide said wavelength selection.

15. A tunable optical source according to claim 14 wherein the controller comprises a device to apply a voltage across material of the tunable diffraction device.

16. A tunable optical source according to claim 14 wherein the controller comprises a device to apply a temperature change to material of the tunable diffraction device.

17. A tunable optical source according to claim 14 wherein the feedback section further comprises an external cavity.

18. A tunable optical source according to claim 17 wherein the external cavity comprises free space and the tunable diffraction device is mounted in said free space.

19. A tunable optical source according to claim 17 wherein the diffractive structure of the tunable diffraction device provides an end facet of the external cavity and plays a part in defining its length.

20. A tunable optical source according to claim 14 wherein the diffractive structure comprises a grating to provide diffraction of incident optical radiation.

21. A tunable optical source according to claim 20 wherein the tunable diffraction device comprises more than one layer of material, the material whose refractive index is controlled by the controller being material of a layer adjacent to or containing the grating and through which optical radiation is incident on the grating in use.

22. A tunable optical source according to claim 14 wherein material of the diffraction device whose refractive index is controlled by the controller is selected from the group comprising glasses, photonic crystals, electro-optic polymers, thermo-optic polymers, liquid crystals, organic crystals, semiconductor materials selected from group IV of the periodic table, compound semiconductor materials selected from one or more of the III–V II–VI and IV–VI groups of the periodic table, and photorefractive materials.

23. A tunable optical source according to claim 14 tunable to provide an optical radiation output tunable over a wavelength range of at least 10 nm.

24. A tunable optical source according to claim 14 tunable to provide an optical radiation output tunable over a wavelength range of at least 30 nm.

25. A tunable optical source according to claim 14 having an optical radiation output tunable by temperature change to show a shift in wavelength of at least 0.3 nm per ° C.

26. A tunable optical source according to claim 14, comprising an array of two or more tunable gain sections.

27. A tunable optical source according to claim 26 wherein, in use, a common diffraction device provides wavelength selection in the feedback to more than one gain section.

28. A tunable optical source according to claim 26 wherein, in use, at least two diffraction devices provide wavelength selection in the feedback to two respective gain sections.

29. A tunable optical source according to claim 14 wherein the feedback section comprises an optical path controller for controlling the length of the optical path of radiation in the feedback section.

30. A tunable optical source according to claim 29 wherein the optical path controller comprises a material whose refractive index is modifiable and the optical source comprises a device to modify said refractive index so as to control the length of the optical path of radiation in the feedback section.

31. A wavelength division multiplexing system comprising an optical source according to claim 14.

* * * * *

UNITED STATES PATENT AND TRADEMARK OFFICE
CERTIFICATE OF CORRECTION

| | | |
|---|---|---|
| PATENT NO. | : 7,027,469 B2 | |
| APPLICATION NO. | : 10/306843 | |
| DATED | : April 11, 2006 | |
| INVENTOR(S) | : Sidorin et al. | |

It is certified that error appears in the above-identified patent and that said Letters Patent is hereby corrected as shown below:

The title page showing the illustrative figure should be deleted to be replaced with the attached title page.

The drawing sheets, consisting of Figs. 1A-1B and 3-8 should be deleted to be replace with drawing sheets, consisting of Figs. 1A-1B and 3-8, as shown on the attached pages.

Signed and Sealed this

Seventh Day of November, 2006

JON W. DUDAS
*Director of the United States Patent and Trademark Office*

(12) United States Patent
Sidorin et al.

(10) Patent No.: US 7,027,469 B2
(45) Date of Patent: Apr. 11, 2006

(54) TUNABLE FILTER

(75) Inventors: Yakov Sidorin, Tucson, AZ (US); Abdul H Damirji, London (GB); Salah A Al-Chalabi, London (GB)

(73) Assignee: Optitune plc, London (GB)

(*) Notice: Subject to any disclaimer, the term of this patent is extended or adjusted under 35 U.S.C. 154(b) by 0 days.

(21) Appl. No.: 10/306,843

(22) Filed: Nov. 29, 2002

(65) Prior Publication Data
US 2003/0214700 A1 Nov. 20, 2003

Related U.S. Application Data

(60) Provisional application No. 60/421,143, filed on Nov. 30, 2001.

(30) Foreign Application Priority Data
Oct. 4, 2002 (GB) .................... 0223052

(51) Int. Cl.
*H01S 3/10* (2006.01)
(52) U.S. Cl. .................... 372/20; 372/102
(58) Field of Classification Search ................ 372/20, 372/96, 99, 102
See application file for complete search history.

(56) References Cited

U.S. PATENT DOCUMENTS

| 4,571,024 A * | 2/1986 | Husbands .......... 385/37 |
| 4,719,635 A | 1/1988 | Yeh .......... 372/50 |
| 4,786,132 A | 11/1988 | Gordon |
| 4,850,682 A | 7/1989 | Gerritsen .......... 349/201 |
| 5,042,898 A | 8/1991 | Morey et al. |
| 5,319,668 A | 6/1994 | Luecke |
| 5,448,398 A | 9/1995 | Asakura et al. .......... 359/328 |
| 5,732,102 A | 3/1998 | Bouadma |
| 5,771,252 A | 6/1998 | Lang et al. |
| 5,870,417 A | 2/1999 | Verdiell et al. |
| 5,943,352 A | 8/1999 | Fee |
| 5,995,521 A | 11/1999 | Moore et al. |
| 6,041,071 A | 3/2000 | Tayebati |

(Continued)

FOREIGN PATENT DOCUMENTS

EP 0 502 682 9/1992

(Continued)

OTHER PUBLICATIONS

Hiroshi, Patent Abstracts of Japan, vol. 012, No. 397 (E-672), Pub. No. 63137493; Oct. 21, 1988, Abstract Only.

(Continued)

*Primary Examiner*—Minsun O Harvey
*Assistant Examiner*—James Menefee
(74) *Attorney, Agent, or Firm*—Nixon & Vanderhye P.C.

(57) ABSTRACT

In a tunable optical source, a diffraction device 115 is used to provide wavelength selective feedback to a laser diode 100. The diffraction device 115 is at least partially fabricated in a material whose refractive index is controllable so as to control the diffraction performance of the device. This allows the diffraction device 115 to be used in tuning the optical source, potentially without using moving parts. For instance, the refractive index can be controlled using a temperature change across material of the device 115. The diffraction device 115 can be mounted in free space in an external cavity with respect to the laser diode 100. Novel forms of diffraction device 115 are described. Tunable optical sources of this type can be used for instance in communications, particularly wavelength division multiplexing.

31 Claims, 6 Drawing Sheets